(12) United States Patent
Goto

(10) Patent No.: US 9,368,381 B2
(45) Date of Patent: Jun. 14, 2016

(54) TRANSFER ROBOT, ITS SUBSTRATE TRANSFER METHOD AND SUBSTRATE TRANSFER RELAY DEVICE

(75) Inventor: Hirohiko Goto, Akashi (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 13/997,366

(22) PCT Filed: Dec. 15, 2011

(86) PCT No.: PCT/JP2011/007027
§ 371 (c)(1),
(2), (4) Date: Aug. 26, 2013

(87) PCT Pub. No.: WO2012/086164
PCT Pub. Date: Jun. 28, 2012

(65) Prior Publication Data
US 2014/0003890 A1 Jan. 2, 2014

(30) Foreign Application Priority Data

Dec. 24, 2010 (JP) .................................. 2010-288084
Dec. 24, 2010 (JP) .................................. 2010-288085

(51) Int. Cl.
*H01L 21/677* (2006.01)
*B25J 15/00* (2006.01)

(52) U.S. Cl.
CPC .......... *H01L 21/677* (2013.01); *B25J 15/0014* (2013.01); *H01L 21/67742* (2013.01); *H01L 21/67766* (2013.01); *H01L 21/67769* (2013.01); *H01L 21/67781* (2013.01)

(58) Field of Classification Search
CPC .............. B65G 49/07; H01L 21/67742; H01L 21/67766; H01L 21/67769; H01L 21/67781
USPC ............................................. 414/806, 222.12
See application file for complete search history.

(56) References Cited

U.S. PATENT DOCUMENTS

| 5,564,889 | A | 10/1996 | Araki |
| 6,158,941 | A * | 12/2000 | Muka et al. ............... 414/222.12 |
| 6,245,156 | B1 | 6/2001 | Taniyama et al. |
| 6,520,733 | B1 * | 2/2003 | Taniyama et al. .......... 414/749.5 |

(Continued)

FOREIGN PATENT DOCUMENTS

| JP | A-7-78858 | 3/1995 |
| JP | A-10-308430 | 11/1998 |

(Continued)

OTHER PUBLICATIONS

International Search Report issued in International Patent Application No. PCT/JP2011/007027 dated Mar. 13, 2012.
Apr. 21, 2015 Office Action issued in Chinese Patent Application No. 2015041601024800.

*Primary Examiner* — Ernesto Suarez
*Assistant Examiner* — Ronald Jarrett
(74) *Attorney, Agent, or Firm* — Oliff PLC

(57) ABSTRACT

A transfer robot is equipped with a first hand and a second hand. The first and the second hands, each have two blades, for holding respective substrates. In addition, the transfer robot includes a rotation unit, a first extension and retraction unit, a second extension and retraction unit and an up-down unit, and by these four units, the first and the second hands can be moved to a substrate transfer relay device where substrates are placed, and to four process chambers.

15 Claims, 10 Drawing Sheets

(56) References Cited

U.S. PATENT DOCUMENTS

| | | | |
|---|---|---|---|
| 7,316,537 B2 * | 1/2008 | Park et al. ................ 414/744.1 |
| 2001/0043849 A1 * | 11/2001 | Perlov et al. ............. 414/222.01 |
| 2005/0027387 A1 | 2/2005 | Fujishima |
| 2005/0155823 A1 * | 7/2005 | Hiroki et al. .................. 187/401 |
| 2008/0124206 A1 * | 5/2008 | Choi ................ H01L 21/67781 |
| | | | 414/744.2 |
| 2008/0159832 A1 * | 7/2008 | Mitsuyoshi ....... H01L 21/67781 |
| | | | 414/217 |
| 2010/0226737 A1 * | 9/2010 | Sakaue et al. ............. 414/217.1 |
| 2010/0240200 A1 | 9/2010 | Sakaue et al. |
| 2010/0249993 A1 * | 9/2010 | Mitsuyoshi ................ 700/228 |

FOREIGN PATENT DOCUMENTS

| | | |
|---|---|---|
| JP | A-2003-179119 | 6/2003 |
| JP | A-2005-51089 | 2/2005 |
| JP | 2008-141158 A | 6/2008 |
| JP | A-2009-59741 | 3/2009 |
| JP | A-2010-045214 | 2/2010 |
| JP | A-2010-206139 | 9/2010 |
| JP | A-2010-219281 | 9/2010 |
| WO | WO 2010/032910 A1 | 3/2010 |

\* cited by examiner

TRANSFER ROBOT, ITS SUBSTRATE TRANSFER METHOD AND SUBSTRATE TRANSFER RELAY DEVICE

TECHNICAL FIELD

The present invention relates to a transfer robot for substrate transfer and a substrate transfer method thereof.

In addition, the present invention relates to a substrate transfer relay device for the relaying of substrates which are delivered between two transfer robots.

BACKGROUND ART

Heretofore, substrate processing systems for the application of process treatments to substrates have been known in the industry. Such a substrate processing system is equipped with a transport robot, a transfer robot and a substrate transfer relay device. The transport robot is configured so as to transport substrates between a hoop and the substrate transfer relay device. On the other hand, the transfer robot is configured so as to transfer substrates between a chamber that carries out a process treatment and the substrate transfer relay device. And, the substrate transfer relay device is configured such that the substrates transported and transferred can be placed thereon, whereby to facilitate the delivery of substrates between the transport robot and the transfer robot.

As an example of the transfer robot of the substrate processing system of the type as described above, there is a substrate transfer robot as set forth in, for example, Patent Literature 1. This substrate transfer robot has two hands each capable of placement and holding of a single substrate. For example, the substrate transfer robot receives, with the aid of one of its two hands, a single substrate placed in the substrate transfer relay device while the other hand is not in use. Thereafter, the substrate transfer robot moves the other hand to a chamber to receive a treated substrate in the chamber, and subsequently places the substrate held in the one hand into the chamber. And, the two hands are brought back again to the substrate transfer relay device, and the treated substrate held in the other hand is retuned to the delivery device while the one hand receives another substrate.

In addition, as another example of the transfer robot of the substrate processing system, there is a substrate processing device as set forth in, for example, Patent Literature 2. This substrate processing device is equipped with a load lock chamber section. The load lock chamber section which includes a buffer unit equivalent to a substrate transfer relay device wherein it is designed such that a substrate transferred from the hoop is placed on the board of the buffer unit. In addition, the board is movable up and down in a vertical direction, thereby enabling a transfer module of the transfer chamber section to receive the substrate placed on the board.

CITATION LIST

Patent Literature

Patent Literature 1: JP-A-2003-179119
Patent Literature 2: JP-A-2010-206139

SUMMARY OF INVENTION

Technical Problem

The demand for substrate processing systems is that the production time taken in the substrate production process should be reduced. However, the reduction in process time taken to process a substrate is difficult to achieve. Therefore, it is required that the production time should be reduced by achieving a reduction in substrate transfer time. As a method for reducing the transfer time in the substrate transfer robot of Patent Literature 1, it is conceivable to achieve a time reduction by increasing the moving speed of the two hands. However, given the positional accuracy and the control accuracy, there is an upper limit to the moving speed, and likewise there are limitations to the transfer time that can be reduced by increasing the moving speed. However, further reductions in transfer time are required for the substrate processing system.

On the other hand, as a method for reducing the transfer time in the substrate processing device of Patent Literature 2, it is conceivable to achieve a time reduction by increasing the moving speed of the transport and transfer robots. However, given the positional accuracy and the control accuracy, there is an upper limit to the moving speed, and likewise there are limitations to the transfer time that can be reduced by increasing the moving speed.

Accordingly, an object of the present invention is to provide a transfer device capable of achieving a reduction in transfer time without increasing the moving speed, a transfer method that employs such a transfer device and a substrate transfer relay device.

Solution to Problem

The present invention provides a transfer robot comprising: a first hand having plural holding sections for holding respective substrates; a second hand having plural holding sections for holding respective substrates; and a moving device that moves the first and the second hands to a standby position where the substrates are placed and to respective plural different transfer positions.

According to the present invention, it is for example possible that, in the standby position, plural substrates are received by the holding sections of the first hand at one time, while plural substrates are handed over by the holding sections of the second hand at one time. Therefore, it is for example possible that substrates held by the first hand are handed over in succession while substrates are received in succession by the second hand, whereby it is only necessary to bring the hands back again to the standby position upon completion of the delivery of substrates at the transfer positions. As a result of this, the distance that the first and the second hands need to travel throughout the whole transfer step can be reduced, and therefore the transfer time taken to transfer substrates to all of the transfer positions can be reduced.

In the present invention, preferably, the moving device may be configured such that plural substrates placed at the standby position are held and received by the plural holding sections of the first hand, after which the plural substrates held by the plural holding sections of the first hand are sequentially handed over to a the respective transfer position while substrates placed at a the respective transfer positions are received by the holding sections of the second hand.

According to this configuration, it is possible to successively carry out the operation of receiving substrates on the other transfer positions. Therefore, there is no need for the first hand to return to the standby position to hold substrates ever time the transfer operation to each transfer position is carried out, and there is no need for the second hand to each time unload substrates held thereby to the standby position, whereby it becomes possible to successively perform the receipt operation on each transfer position. Therefore, it is possible to diminish the distance that the first and second hands need to travel, thereby making it possible to reduce the transfer time taken to transfer substrates to all of the transfer positions.

In the present invention, it is preferred that the standby position is a position at which the plural substrates can be kept on standby and at which the substrates are delivered between itself and a hoop by a transport robot, and that the moving device moves the first and the second hands in order that plural substrates held by the plural holding sections of the second hand are placed at the standby position.

According to this configuration, it is possible that plural substrates are previously transferred by the transport robot from the hoop to the standby position where the substrates thus transported are kept on standby. This makes it possible for the first hand to hold plural substrates at one time, whereby the transfer time is reduced. On the other hand, it is possible that plural substrates held by the first hand can be unloaded to the standby position, and then they are brought back to the hoop by the transfer robot. Therefore, there is no need to unload substrates one by one, thereby making it possible to shorten the transfer time.

In the present invention, the handover operation of the first hand and the receipt operation of the second hand can be carried out at the same position (at the standby position) as described above, whereby the distance that the first and second hands need to travel is shortened, thereby making it possible to shorten the transfer time.

In the present invention, it is preferred that the moving device is configured such that, in a single transfer process, the substrates are handed over respectively to predefined N transfer positions, that the first hand has N or more holding sections, and that the second hand has N or more holding sections.

According to this configuration, it is possible that the receipt operation at the N transfer positions to which substrates are handed over in a single transfer process can be carried out in succession, thereby making it possible to further shorten the transfer time.

In the present invention, the moving device is configured such that the first and the second hands rotate together; there are N transfer positions on one side and on the other side in the rotation direction relative to the standby position; and the moving device is configured such that:

in a first transfer step, subsequently to receipt of N substrates at the standby position, the first and the second hands are rotated towards the one side so that the received N substrates are handed over sequentially respectively to the N transfer positions situated on the one side, whereas in a second transfer step, subsequently to receipt of N substrates at the standby position, the first and the second hands are rotated towards the other side so that the received N substrates are handed over sequentially respectively to the N transfer positions situated on the other side.

According to this configuration, it is possible to hold down not only the distance that the first and second hands need to travel but also the number of holding sections. As a result of this, it becomes possible to prevent increase in the number of component parts as well as to achieve reduction in the transfer time.

In the above invention, it is preferred that N representative of the number of the transfer positions is two.

According to this configuration, it is possible to prevent increase in the number of component parts while at the same time achieving reduction in the transfer time.

In the above invention, it is preferred that the moving device is configured such that the first and the second hands are moved such that plural substrates placed at the standby position are received at one time by the plural holding sections of the first hand while plural substrates held respectively by the plural holding sections of the second hand are placed and handed over at one time to the standby position.

According to this configuration, it is possible that at the standby position, plural substrates can be held at one time by the first hand while plural substrates can be unloaded at one time by the second hand. Therefore, both the holding time and the unloading time can be shortened.

In the above invention, it is preferred that the moving device comprises an extension and retraction unit by which the first and the second hands are individually extended and retracted in their respective extending directions and an up-down unit by which the first and the second hands are moved up and down together; after the plural holding sections of the first hand are extended respectively under plural substrates placed at the standby position by the extension and retraction unit, the first and the second hands are moved up by the up-down unit, whereby the plural substrates placed at the standby position are held at one time by the holding sections of the first hand, after which the first hand is retracted by the extension and retraction unit for reception of the plural substrates from the standby position; and after the plural holding sections of the second hand are extended above the standby position by the extension and retraction unit, the first and the second hands are moved down by the up-down unit, whereby the plural substrates held by the holding sections of the second hand are placed at the standby position at one time, after which the second hand is retracted by the extension and retraction unit for handover of the substrates to the standby position.

According to this configuration, it is possible that just by extension and retraction movement and up and down movement of the first hand, plural substrates can be held at the standby position while just by extension and retraction movement and up and down movement of the second hand, plural substrates can be unloaded to the standby position.

The present invention provides substrate transfer method for a transfer robot which comprises a first hand having plural holding sections for holding respective substrates; a second hand having plural holding sections for holding respective substrates; and a moving device that moves the first and the second hands to a standby position where the substrates are placed and to respective plural different transfer positions, the substrate transfer method comprising: a receipt step in which, by the moving device, the plural holding sections of the first hand hold and receive plural substrates placed at the standby position; and a transfer step, following the holding step, in which the plural substrates held by the holding sections of the first hand are sequentially handed over to the transfer positions while substrates placed at the respective transfer positions are transferred by the holding sections of the second hand.

According to this configuration, since the first hand is capable of holding plural substrates, it is possible that in the standby position, plural substrates can be held by the first hand. In addition, since the second hand is likewise capable of holding plural substrates, this allows for successive receipt of substrates with respect to plural transfer positions by the first and the second hands. Therefore, it is possible that the operation in which the first hand holds then unloads substrates and the operation in which the second hand unloads then holds substrates can be carried out together with respect to plural substrates, thereby making it possible to shorten the transfer time.

In the above invention, it is preferred that the standby position is a position at which plural substrates can be kept on standby and at which the substrates are delivered between itself and a hoop by a transport robot, and that the substrate transfer method further comprises a handover step in which the moving device moves the first and the second hands in order that plural substrates held by the plural holding sections of the second hand are placed at the standby position.

According to this configuration, since the handover operation of the first hand and the receipt operation of the second hand can be carried out at the standby position, this eliminates the need to move the first and the second hands in the delivery operation. Therefore, it is possible to shorten the distance that the first and the second hands need to travel, thereby making it possible to shorten the transfer time.

In addition, according to this configuration, the substrates retrieved from a hoop by the transport robot are kept on standby at the standby position, after which they are handed over in succession to respective transfer positions by the first hand. Additionally, prior to the handover, the first hand receives and holds substrates put at the transfer position, and after the handover to each transfer position, the substrates are handed over to the standby position. And, the substrates handed over to the standby position can be brought back to the hoop by the transfer robot. Therefore, it is possible to omit the time required for the handover between the standby position and the hoop, thereby making it possible to achieve reduction in the transfer time.

In the above invention, it is preferred that the receipt step and the handover step are carried out at the same time.

According to this configuration, it is possible to omit the waiting time that elapses before the substrate is received and the waiting time that elapses before the substrate is handed over. Therefore, it is possible to further shorten the transfer time.

In the above invention, it is preferred that in the transfer step, the substrates are sequentially delivered to the adjacent transfer positions.

According to this configuration, it is possible to shorten the distance that the first and the second hands need to travel. This makes it possible to further shorten the transfer time.

The present invention provides a substrate transfer relay device for relaying, at the time of substrate delivery between two transfer robots having hands for holding substrates, the substrates. The substrate transfer relay device comprises: a first support body having a first support section for supporting the substrate wherein by upward movement of the first support body, a substrate supported by the hand is received and supported by the first support section while by downward movement of the first support body, the substrate supported by the first support section is handed over to the hand; a second support body having a second support section for supporting, above the first support section, a substrate, wherein by upward movement of the second support body, a substrate supported by the hand is received and supported by the second support section while by downward movement of the second support body, the substrate supported by the second support section is handed over to the hand; a first up-down mechanism configured so as to move the first support body up and down; and a second up-down mechanism configured so as to move the second support body up and down, wherein it is configured such that the second up-down mechanism moves the second support body downward when the first up-down mechanism moves the first support body upward while the second up-down mechanism moves the second support body upward when the first up-down mechanism moves the first support body downward.

According to this configuration, it is possible that by downward movement of the first support body, the substrates supported by the first support section are handed over to the hand, and by upward movement of the second support body, the substrates held by the hand are received and supported by the second support section. On the other hand, it is possible that by upward movement of the first support body, the substrates held by the hand are received by the first support section, and by downward movement of the second support body, the substrates supported by the second support section are handed over to the hand. Accordingly, the handover of substrates from the substrate transfer relay device to the hand and the receipt of substrates from the hand to the substrate transfer relay device can be carried out at the same time. This makes it possible to shorten the handover time between the hand and the substrate transfer relay device, whereby the transfer time can also be shortened.

In the above invention, it is preferred that: at least one of the transfer robots is provided with two hands serving respectively as a first hand and a second hand; the first and the second hands are disposed side by side at a predetermined vertical distance from each other, each of which has N holding sections for holding respective substrates where N is an integer number equal to or more than two; the first support bodies are disposed side by side at a predetermined vertical distance from each other, each of which has N first support sections for supporting respective substrates so that they are aligned in a vertically direction; the second support bodies are disposed side by side at a predetermined vertical distance from each other, each of which has N second support sections for supporting respective substrates so that they are aligned in a vertically direction; the N first support sections are provided correspondingly to the N holding sections of the first hand wherein it is configured such that by upward and downward movement of the first support bodies, substrates are delivered between the N first support sections and their corresponding N holding sections; and the N second support sections are provided correspondingly to the N holding sections of the second hand wherein it is configured such that by upward and downward movement of the second support bodies, substrates are delivered between the N second support sections and their corresponding N holding sections.

According to this configuration, it is possible that the relay device hands over plural substrates to one hand at the same time while the relay device receives plural substrates from the other hand at the same time. Therefore, it is possible to deliver more substrates in a single operation. This makes it possible to shorten the transfer time.

In the above invention, it is preferred that the first and the second support sections each comprise a pair of hook-shaped members spaced apart across a space in a predetermined horizontal direction, the pairs being formed respectively in the first and the second support bodies so as to support the outer edge of substrates.

According to this configuration, there is a space between a pair of the hook-shaped members. Therefore, if, with substrates supported in a pair of the hook-shaped members, the holding sections of the hand are positioned thereunder and then the first support body is moved downward, this makes it possible for the pair of the hook-shaped members to hand over the substrates to the hand. On the other hand, if, with the holding sections of the hand positioned above a pair of the hook-shaped members, the first support body is moved upward, this makes it possible for the pair of the hook-shaped members to receive the substrates from the hand. This is the same as for the second support body, and the delivery of substrates between the robot and the substrate transfer relay device is facilitated accordingly.

In the above invention, it is preferred that the first up-down mechanism is an up-down cylinder mechanism for up and down movement of the first support body, and that the second up-down mechanism is a rack and pinion mechanism for moving the second support body up and down according to up and down movement of the first support body so that the first and the second support bodies move up and down in opposite directions to each other.

According to this configuration, the present invention is achieved by a simple configuration, and it is possible to restrain increase in the number of component parts. This makes it possible to restrain increase in the cost of manufacture of the substrate transfer relay device.

Advantageous Effects of Invention

According to the present invention, it becomes possible to make the transfer time shorter without having to increase the moving speed.

These objects as well as other objects, features and advantages of the present invention will become apparent to those skilled in the art from the following detailed description with reference to the accompanying drawings.

DESCRIPTION OF EMBODIMENTS

In the following, with reference to these drawing figures, a description will be given with regard to a substrate processing system 1 equipped with a transfer robot 50 according to an embodiment of the present invention. In addition, it should be noted that the concept of "direction" (e.g., up and down, right and left, front and rear et cetera) in the embodiments of the present invention is used for convenience of description, and it therefore does not suggest that, with respect to the transfer robot 50 and the substrate processing system 1, their configuration arrangement and orientation is limited thereto. In addition, the transfer robot 50 and the substrate processing system 1 to be hereinafter described are shown by way of example of the present invention. The present invention is therefore not limited to the embodiments described here, and it will be appreciated that additions, deletions and modifications not departing from the scope of the present invention may be made.

(Substrate Processing System)

Figure 1:
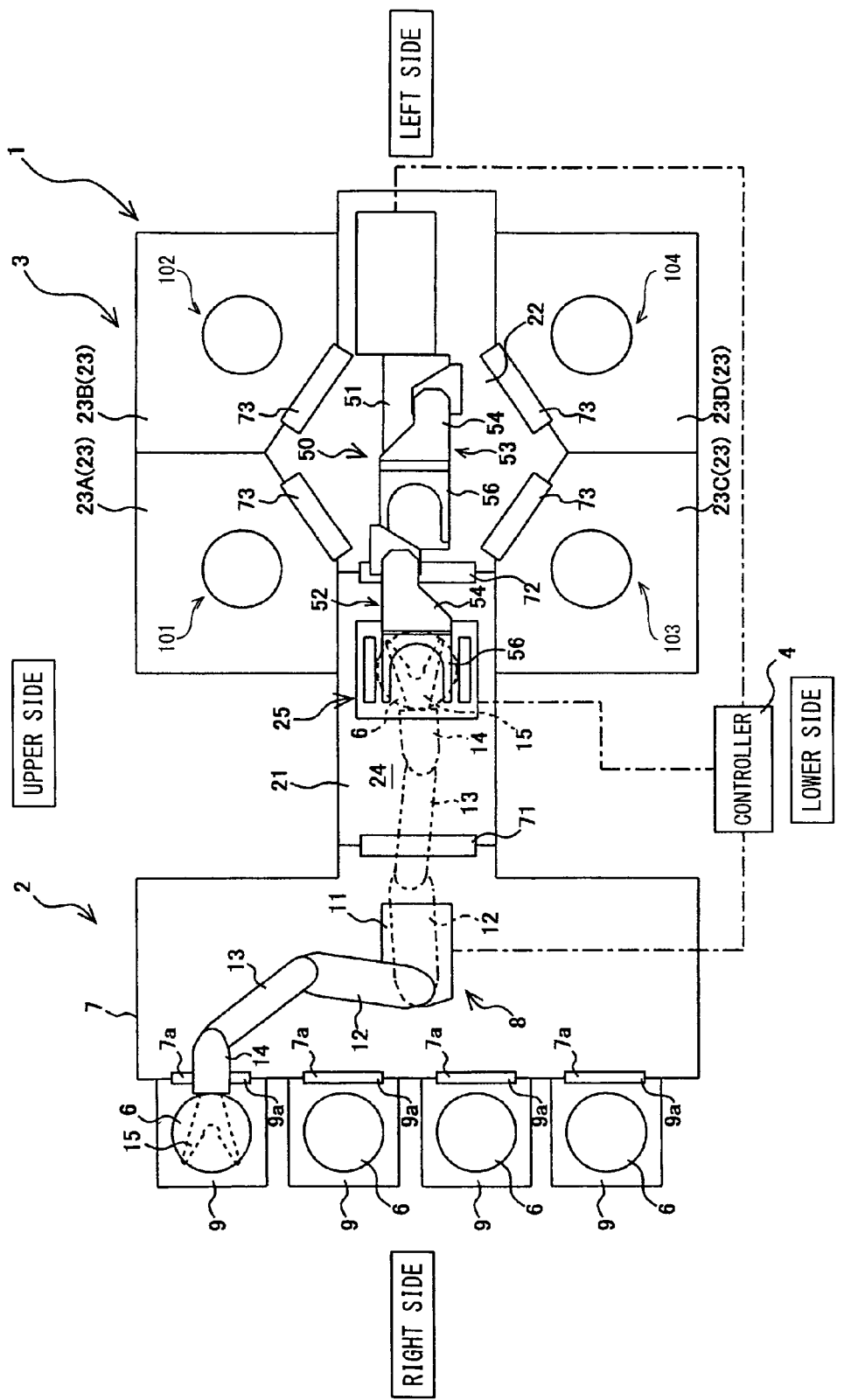
FIG. 1 is a top plan view showing a substrate processing system equipped with a transfer robot according to an embodiment of the present invention.

The substrate processing system 1 is an apparatus that performs, on a substrate such as a semiconductor wafer, a glass substrate and other like substrate, various processing treatments such as heat treatment, impurity doping treatment, thin film forming treatment, lithography treatment, cleaning treatment, planarizing treatment and other like treatment. As it is shown in FIG. 1, the substrate processing system 1 is equipped with a front end module (abbreviated as EFEM) 2, a process module 3 and a controller 4.

(EFEM)

The front end module 2 is a device used for transporting substrates 6 to the process module 3. And the front end module 2 is equipped with a housing 7 and a transport robot 8. The housing 7 is generally in the shape of a rectangular when viewed from top. The housing 7 is provided, on one side thereof (the right-hand side surface in FIG. 1), with plural hoops 9 (four hoops 9 in the present embodiment). The hoops 9 are each configured so as to accommodate plural substrates 6 stacked together in an upward direction. These substrates 6 are kept clean by a mini-environment. In addition, each hoop 9 is provided with a respective coupling port 9a, and the housing 7 is provided with coupling ports 7a that are formed so as to correspond respectively to the coupling ports 9a. By this arrangement, the interior of each hoop 9 and the interior of the housing 7 are brought into communication with each other via the coupling ports 9a, 7a. In addition, the coupling ports 7a, 9a are provided with respective doors that allow for opening and closing of the coupling ports 7a, 9a. Accommodated within the housing 7 configured as above is a transport robot 8.

The transport robot 8 is a robot used for transporting substrates 6 to the process module 3, And the transport robot 8 is implemented using, for example, a horizontal triaxial robot. The transport robot 8 is provided with a base 11, three arms 12, 13, 14 and a hand 15. The base 11 is firmly secured to the housing 7. And the base 11 is provided with a shaft member (not shown) which is movable up and down or extendable and contractible in a vertical direction. In addition, the first arm 12 is mounted at the upper end portion of the shaft member.

Additionally, the first arm 12 which is attached at its base end portion to the shaft member is configured such that it is rotatable against the shaft member. In addition, the base end portion of the second arm 13 is attached rotatably to the tip end portion of the first arm 12. And attached rotatably to the tip end portion of the second arm 13 is the third atm 14. Furthermore, the hand 15 is firmly secured to the tip end portion of the third arm 14. The hand 15 is formed such that it becomes larger in width from its base end portion firmly secured to the third arm 14 towards its tip end portion. In addition, the hand 15 forks from its intermediate portion to its tip end portion. Moreover, mounted atop the hand 15 is a clamp mechanism (not shown) for clamping substrates 6 placed on the top of the hand 15, whereby the substrates 6 are placed and held on the hand 15.

Figure 2:
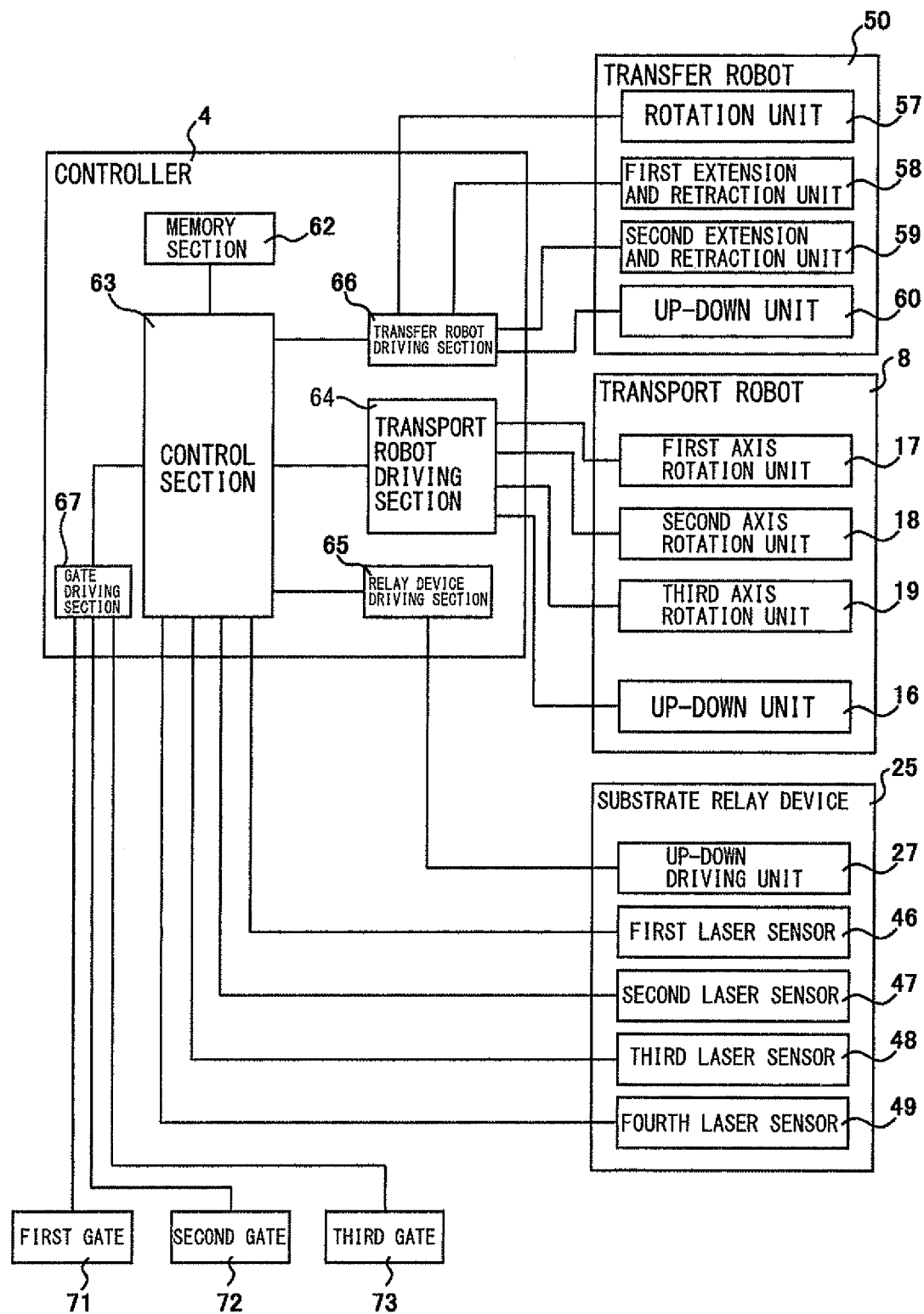
FIG. 2 is a block diagram showing an electric configuration for the substrate processing system shown in FIG. 1.

In addition, as it is shown in FIG. 2, the transport robot 8 includes an up-down unit 16, a first rotation unit 17, a second rotation unit 18 and a third rotation unit 19. The up-down unit 16 is mounted on the base 11. The up-down unit 16 has such a function that the shaft member is moved up and down or extended and contracted in a vertical direction. For example, the up-down unit 16 is comprised of a cylinder mechanism and a pump. On the other hand, the first rotation unit 17, the second rotation unit 18 and the third rotation unit 19 are mounted respectively to the base 11, the first arm 12 and the second arm 13. The first rotation unit 17, the second rotation unit 18 and the third rotation unit 19 are configured so as to respectively rotate the first arm 12, the second arm 13 and the third arm 14, and each of the rotation units is comprised of an electric motor and a transmission mechanism such as a gear mechanism, a belt mechanism et cetera. These four units 16-19 are connected to the controller 4 and their operations are controlled by the controller 4.

The transport robot 8 configured as above moves the hand 15 up and down by vertical movement of the shaft member by the up-down unit 16. In addition, the transport robot 8 moves the hand 15 to any position by rotational movements of the three arms 12, 13, 14 by the first, the second and third rotation units 17, 18 and 19. By combination of these movements, the transport robot 8 holds substrates 6 within the hoop 9 on the hand 15 and then transports the substrates 6 to the process module 3. The process module 3 to which substrates 6 are transported as described above is mounted on the other side surface of the front end module 2 (the left-hand side surface in FIG. 1).

(Process Module)

The process module 3 includes a load lock chamber 21, a robot chamber 22 and a process chamber 23. The load lock chamber 21 which is a vacuum chamber that forms a load lock room 24 is provided in the interior of the front end module 2. Arranged between the front end module 2 and the load lock chamber 21 is a first gate 71, and the interior of the front end module 2 and the load lock room 24 are connected through the first gate 71. The hand 15 of the transport robot 8 is able to move forward to halfway of the load lock room 24 by way of the first gate 71 where a substrate transfer relay device 25 is provided. The substrate transfer relay device 25 which is a device for the relaying of substrates 6 is configured such that plural substrates 6 can be placed and supported thereon. In the following, a description will be given with regard to a specific configuration for the substrate transfer relay device 25.

Figure 3:
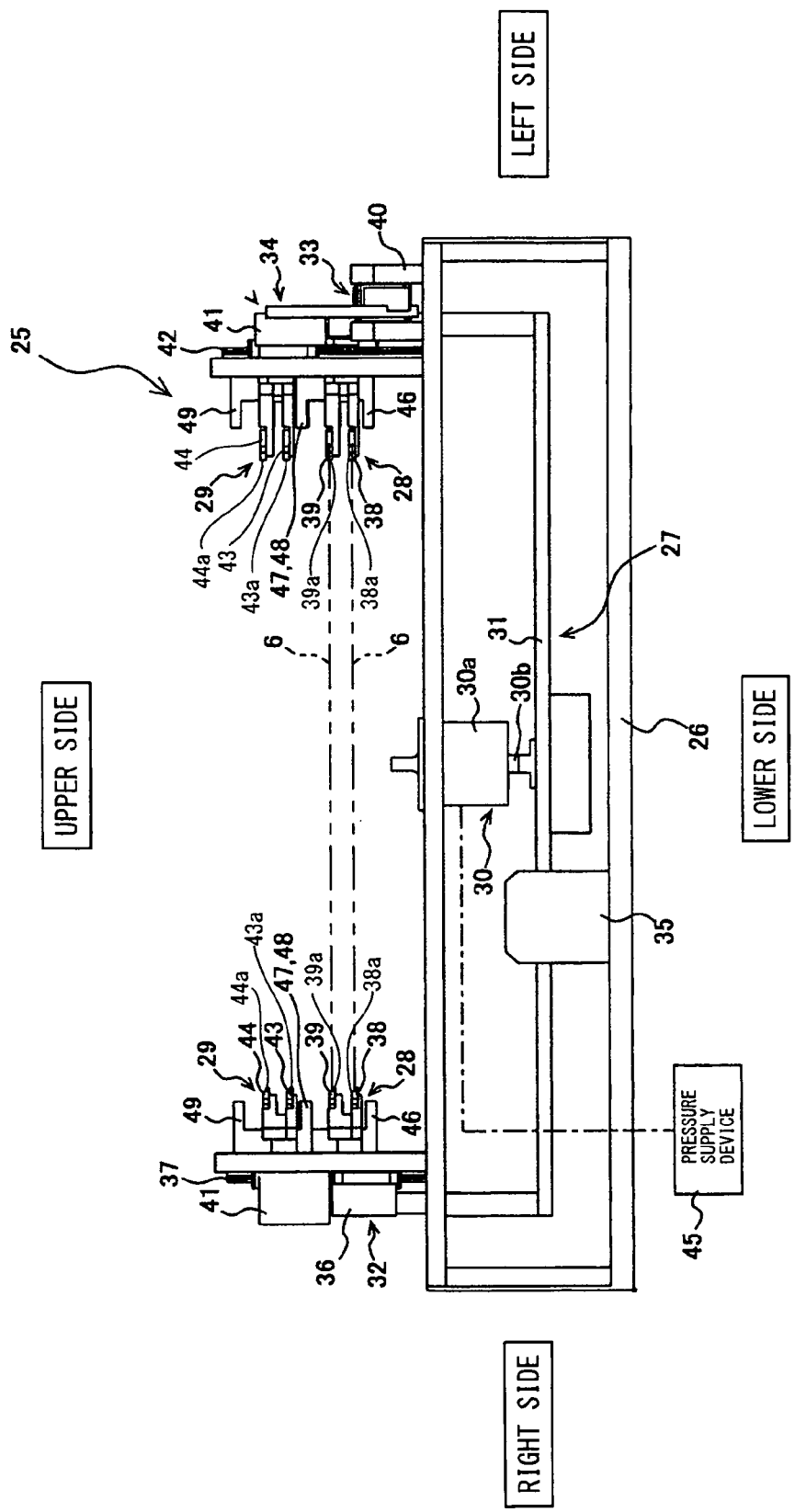
FIG. 3 is a front view showing a substrate transfer relay device of the substrate processing system shown in FIG. 1.
Figure 4:
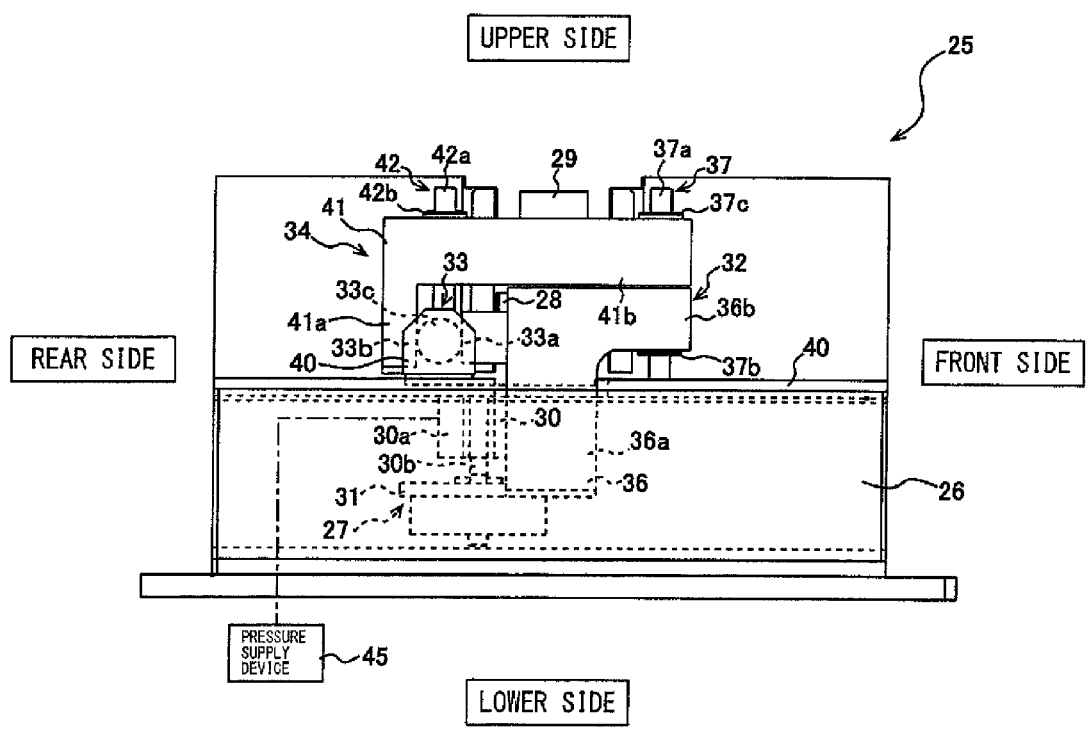
FIG. 4 is a side view of the substrate transfer relay device of FIG. 3 when viewed from the right-hand side thereof.

As it is shown in FIGS. 3 and 4, the substrate transfer relay device 25 includes a base frame 26, an up-down driving unit 27 and two support bodies 28, 29. The base frame 26 is shaped generally like a rectangular parallelepiped, and at least a part of the configuration of the up-down driving unit 27 is arranged in the base frame 26. The up-down driving unit 27 has an up-down cylinder mechanism 30, an up-down board 31, a first up-down mechanism 32, a cooperative mechanism 33, a second up-down mechanism 34 and a pressure supply source 45.

The up-down cylinder mechanism 30 has a cylinder 30a and a rod 30b. The cylinder 30a is secured firmly to the base frame 26, and the rod 30b is mounted in an extendable and retractable manner to the cylinder 30a. In addition, the cylinder 30a is connected to the pressure supply source 45 such as a pump installed outside the base frame 26, whereby upon application of a pressure from the pressure supply source 45, the rod 30b extends and retracts in a vertically direction. The up-down board 31 is secured firmly to the tip end portion of the rod 30b.

The up-down board 31 which is in the form of a flat plate extending in the longitudinal direction of the base frame 26 (the horizontal direction in FIG. 3) moves up and down cooperatively with the rod 30b. Attached to the up-down board 31 is an up-down guide mechanism 35. The up-down guide mechanism 35 which is a slide mechanism secured firmly to the base frame 26 has such a function that the up-down board 31 which moves up and down is guided in a vertical direction. In addition, the up-down board 31 is provided, at either longitudinal end thereof, with a first up-down mechanism 32. In other words, the up-down board 31 is provided with a pair of first up-down mechanisms 32. In addition, the pair of the first up-down mechanisms 32 are arranged such that they are positioned so as to be rotation-symmetric with each other. In the following, a description will be given only with regard to the first up-down mechanism 32 that is arranged on the right-hand side in FIG. 4. And, the other first up-down mechanism 32 arranged on the left-hand side is assigned the same reference numeral and its description is omitted here.

The first up-down mechanism 32 has a first up-down movable section 36 and a first slide mechanism 37. The first up-down movable section 36 which is a board-like member shaped like a letter "L" when viewed from the right-hand side extends vertically on the up-down board 31. The vertically arranged first up-down movable section 36 has a first extending section 36a which extends upward vertically from the up-down board 31 and a first bend portion 36b which curves forward from the upper side portion of the first extending section 36a. And the first bend portion 36b is provided with the first slide mechanism 37.

The first slide mechanism 37 has a guide rail 37a and a slide section 37b. The guide rail 37a is arranged on top of the base frame 26 so that it extends in a vertical direction, and the guide rail 37a is provided with the slide section 37b. The slide section 37b which is shaped generally like a rectangular parallelepiped is operable to travel in a vertical direction along the guide rail 37a. The first up-down movable section 36 which is secured firmly to the slide section 37b is guided by the first slide mechanism 37 in a vertical direction. In addition, the first extending section 36a of the first up-down movable section 36 is provided with the first support body 28 shown in FIG. 3.

The first support body 28 on each side has two first support sections 38, 39. These two first support sections 38, 39 are shaped generally like a circular arc when viewed from top, and their both ends are provided with hook elements 38a, 39a respectively. The hook elements 38a, 39a which are hook-shaped members are provided as a pair on the both ends. And, the first support sections 38, 39 support the outer edge of substrates 6 with the aid of the paired hook elements 38a, 39a. These two first support sections 38, 39 are arranged such that they overlap one another when viewed from top, with a vertical clearance gap spacing defined therebetween. This vertical clearance gap spacing is such a spacing that sufficiently allows for insertion of the hand 15 and the after-mentioned blades 55, 56 therein.

The first support bodies 28 are respectively provided, in paired relation, in the first up-down movable sections 36 arranged one on each horizontal side. The pair of the first support bodies 28 face each other, and they are positioned so as to be spaced apart from each other in a horizontal direction. Because of this, the two first support sections 38, 39 are arranged in paired relation so as to face each other across a space therebetween, and the rotation-symmetric positions of the outer edge of substrates 6 are supported respectively by the pair of the first support sections 38, 39, thereby allowing for simultaneous supporting of two substrates 6 by the first support bodies 28.

The pair of the first support bodies 28 configured as above are firmly secured respectively to the first up-down movable sections 36 arranged on each horizontal side, and it is arranged such that the pair of the first up-down movable sections 36 move together with the up-down board 31. Therefore, the pair of the first support bodies 28 move up and down cooperatively with each other by movement of the up-down cylinder mechanism 30, and they are allowed to move up and down, with the substrates 6 kept in a parallel state. In order that the second up-down mechanism 34 is moved cooperatively with the up-down operation of the first up-down mechanism 32 configured as above, the first up-down movable section 36 is provided with the cooperative mechanism 33.

The cooperative mechanism 33 is comprised of a so-called rack and pinion mechanism, and as it is shown in FIG. 4, it has two rack members 33a, 33b and a pinion member 33c. The first rack member 33a which is provided on the rear side of the first up-down movable section 36 engages the pinion member 33c. The pinion member 33c is rotatably mounted to a mount base 40 provided in the base frame 26. And, it is arranged such that the pinion member 33c rotates as the first rack member 33a moves up and down. In addition, the second rack member 33b engages the pinion member 33c. The second rack member 33b is positioned opposite to the first rack member 33a across the pinion member 33c (that is, on the rear side). And it is arranged such that upon rotation of the pinion member 33c, the second rack member 33b moves in a direction opposite to the direction in which the first rack member 33a rotates. In other words, it is arranged such that the second rack member 33b moves upward when the first rack member 33a moves downward and on the other hand, the second rack member 33b moves downward when the first rack member 33a moves upward. The second rack member 33b configured as above is provided integrally with the second up-down mechanism 34.

The second up-down mechanism 34 has a second up-down movable section 41 and a second slide mechanism 42. The second up-down movable section 41 is a board-like member shaped like a letter "L" when viewed from the right-hand side, and has a second extending section 41a which extends in a vertical direction and a second bend section 41b which curves forward from the upper side of the second extending section 41a. The second extending section 41a and the extending section 36a of the first up-down movable section 36 are provided side by side with each other, and the second rack member 33b is provided integrally to the lower end side of the front section oriented in the direction of the extending section 36a. The second bend section 41b is provided, at its base portion in connection with the second extending section 41a, with the second slide mechanism 42.

Like the first slide mechanism 37, the second slide mechanism 42 has a guide rail 42a and a slide section 42b. The guide rail 42a is so arranged on top of the base frame 26 as to extend in a vertical direction. And, the guide rail 42a is provided with the slide section 42b capable of travelling therealong. The slide section 42b is secured firmly to the base portion of the second bend section 41b. In addition, the tip end portion of the second bend section 41b extends up to the guide rail 37a of the first slide mechanism 37, and the slide section 37c is secured firmly thereto. The slide section 37c is provided such that it is movable up and down along the guide rail 37a of the first slide mechanism 37. In the way as described above, the second up-down movable section 41 is guided movably up and down by the first and the second slide mechanisms 37, 42 and there is provided, in the middle of the second bend section 41b, the second support body 29.

The second support body 29 on each side has two second support sections 43, 44. The second support sections 43, 44 are shaped generally like a circular arc when viewed from top, and their both ends are provided with hook elements 43a, 44a respectively. The hook elements 43a, 44a which are hook-shaped members are provided in paired relation on the both ends. And, the second support sections 43, 44 support the outer edge of substrates 6 with the aid of the pair of the hook elements 43a, 44a. These two second support sections 43, 44 are arranged such that they overlap one another when viewed from top, with a vertical clearance gap spacing defined therebetween. This vertical clearance gap spacing is such a spacing that sufficiently allows for insertion of the hand 15 and the after-mentioned blades 55, 56 therein.

The second support bodies 29 are respectively provided, in paired relation, in the second up-down movable sections 41 arranged one on each horizontal side. The pair of the second support bodies 29 face each other, and they are positioned so as to be spaced apart from each other in a horizontal direction. Because of this, the two second support sections 43, 44 are arranged in paired relation so as to face each other across a space therebetween, and the rotation-symmetric positions of the outer edge of substrates 6 are supported respectively by the pair of the second support sections 43, 44, thereby allowing for simultaneous supporting of two substrates 6 by the second support bodies 29.

Figure 5:
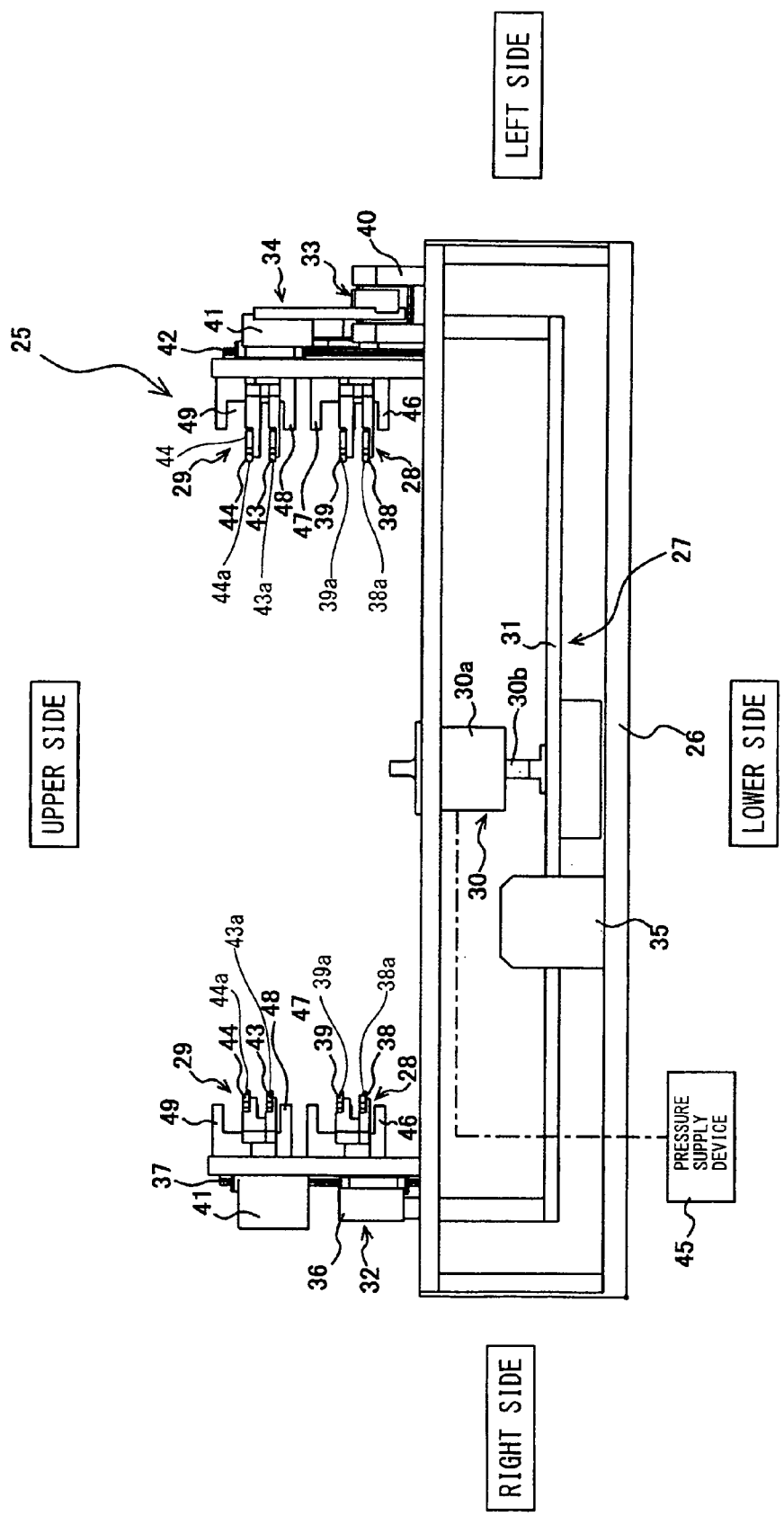
FIG. 5 is a front view of the substrate transfer relay device of FIG. 3, with its first and second support bodies moved up and down respectively.

The pair of the second support bodies 29 configured as above are secured thinly to the second up-down movable sections 41 on either horizontal side, and it is arranged such that the second up-down movable section 41 moves cooperatively with the first up-down movable section 36. Therefore, the pair of the second support bodies 29 move up and down cooperatively with each other in the same way that the pair of the first up-down movable sections 36 move cooperatively with each other so that they are allowed to move up and down with the substrates 6 kept in a parallel state. In addition, it is arranged such that the second up-down movable section 41 moves oppositely to the direction in which the first up-down movable section 36 moves, whereby it is also possible for the pair of the second support bodies 29 to move oppositely to the direction in which the pair of the first support bodies 28 move. For example, as it is shown in FIG. 5, if the pair of the first support bodies 28 are made to move downward, this makes it possible to move the pair of the second support bodies 29 upward. Accordingly, the pair of the first support bodies 28 and the pair of the second support bodies 29 are configured such that the vertical spacing therebetween can be changed between a reference spacing at which they come closest to each other in a vertical direction and a separation spacing at which they are separated from each other more than at the reference spacing.

In the substrate transfer relay device 25 configured as above, it is arranged such that when the pressure supply source 45 is driven to provide the supply of air pressure to the up-down cylinder mechanism 30, either one of the pair of the first support bodies 28 and the pair of the second support bodies 29 are made to move upward or downward in an opposite direction to the direction in which the other pair move. The up-down driving unit 27 including the pressure supply source 45 is connected to the controller 4, and its operation (more specifically, the supply operation of the pressure supply source 45) is controlled by the controller 4.

Furthermore, as it is shown in FIGS. 2, 3 and 5, the substrate transfer relay device 25 has four laser sensors 46-49.

These four laser sensors 46, 47, 48, 49 are provided so as to correspond to the first and the second support sections 38, 39 and 43, 44, respectively. The first to the fourth laser sensors 46-49 are each disposed in the middle of their corresponding one of the support sections 38, 39, 43, 44. The laser sensors 46-49 are laser sensors of the so-called transmissive or reflective type, and have a function of detecting whether or not the substrates 6 are placed on the support sections 38, 39. The laser sensors 46-49 are connected to the controller 4, and it is arranged such that they each send a detection result to the controller 4.

As it is shown in FIG. 1, the substrate transfer relay device 25 configured as above is positioned halfway down the interior of the load lock chamber 21 from the first gate 71. Provided further ahead of where the substrate transfer relay device 25 is positioned is the openable/closable second gate 72, and there is provided ahead of the second gate 72 the robot chamber 22. The robot chamber 22 is a vacuumed chamber in which to accommodate the transfer robot 50.

The transfer robot 50 is equipped with a base 51 and two hands 52, 53. The base 51 is attached rotatably to the robot chamber 22, and the two hands 52, 53 are provided there. The first hand 52 and the second hand 53 have the same configuration. In the following, a description will be given only in regard to the configuration of the first hand 52, and in regard to the configuration of the second hand 53, like reference numerals are assigned to the same parts as the first hand 52 and their description is omitted here accordingly.

The first hand 52 includes a hand body 54 and two blades 55, 56. The hand body 54 which has generally a board-like shape when viewed from top is configured such that it is extendable and retractable relative to the base 51. More specifically, the hand body 54 is configured such that it can travel between the delivery position where at least a part thereof extends from the base 51 by forward and backward movement and the rotational position where the part is withdrawn so as to overlap with the base 51 when viewed from top. To explain this more fully, it is arranged such that the hand body 54 is mounted, for example, at its base end, to the base 51 through a slider mechanism (not shown), whereby the hand body 54 is moved forward and backward by this slide mechanism. In addition, the two blades 55, 56 are attached integrally to the tip end portion of the hand body 54.

Figure 6:
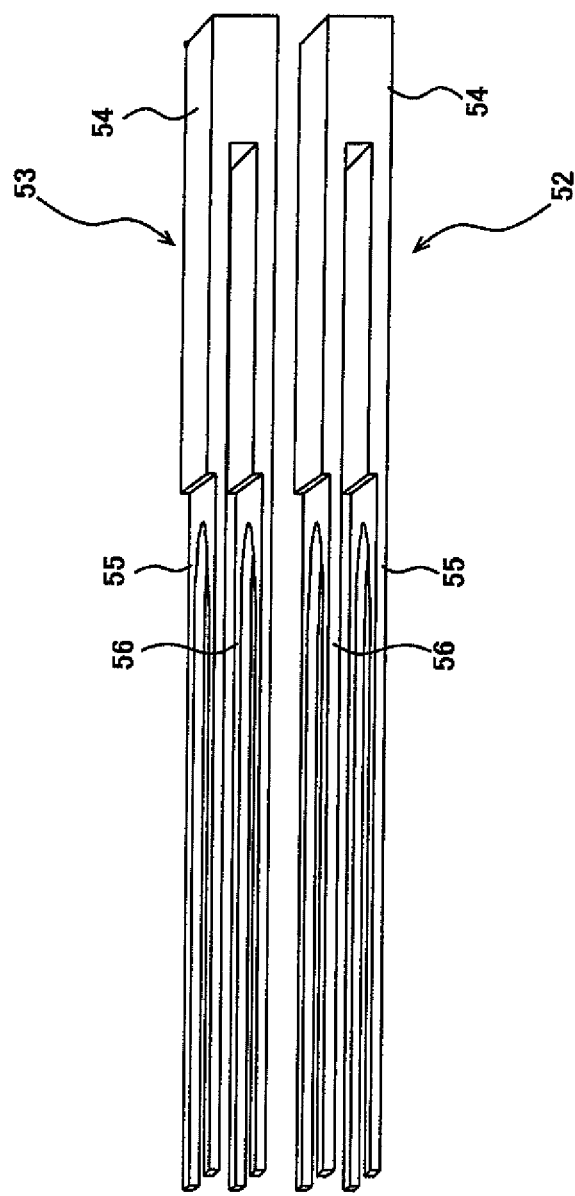
FIG. 6 is an enlarged perspective view showing in an enlarged manner a first and a second hand of the transfer robot of FIG. 1.

As it is shown in FIG. 6, the two blades 55, 56 are two holding sections that extend in the same direction that the hand body 54 moves forward, and the hand body 54 divides into two parts from its middle part to its tip end portion so as to have generally a shape of letter "U" when viewed from top. In addition, FIG. 6 shows, for the sake of description, only portions of the first and the second hands 52, 53 ahead of the hand body 54. The two blades 55, 56 are mounted to the hand body 54 in such a manner that they are not only vertically spaced from each other, but also they are overlapped with each other when viewed from top. In addition, the two blades 55, 56 are positioned such that there is defined therebetween at least a vertical spacing that sufficiently allows for insertion of the substrate 6 therein. In addition, it is preferred that the spacing between the blades 55, 56 be equal to the spacing between the two first support sections 38, 39 and to the spacing between the two second support sections 43, 44. In addition, the two blades 55, 56 are configured such that the substrate 6 can be placed on each blade, and there is mounted on their upper surface a hold mechanism (not shown) for clamping and holding the substrate 6. In the first hand 52 configured as above, its two blades 55, 56 carry thereon respective substrates 6 at the same time. That is, it is possible for the first hand 52 to hold two substrates 6 at the same time.

On the other hand, the second hand 53 which underlies the first hand 52 so as to overlap therewith is mounted to the base 51 so that there is defined between itself and the first hand 52 at least a spacing that sufficiently allows for insertion of the substrate 6 in the upper blade 55 of the second hand 53. The second hand 53 mounted as above is configured such that it extends and retracts not only in the same direction that the first hand 52 extends and retracts but also independently from the first hand 52. In addition, as it is shown in FIG. 2, the transfer robot 50 which is equipped with a rotation unit 57, a first extension and retraction unit 58, a second extension and retraction unit 59 and an up-down unit 60 is configured such that the first and the second hands 52, 53 are rotated, extended and retracted and moved up and down with the aid of these units 57-60. In the following, a description will be given in regard to the operation of each unit.

The rotation unit 57 is disposed in the robot chamber 22. The rotation unit 57 which is a so-called electric motor has a function of rotationally driving the base 51. In addition, the first and the second extension and retraction units 58, 59 are disposed in the base 51. The first extension and retraction unit 58 has a function that allows for extension and retraction movement of the first hand 52, while the second extension and retraction unit 59 has a function that allows for extension and retraction movement of the second hand 53. The first and the second extension and retraction units 58, 59 are each comprised, for example, of an electric motor, a power transmission mechanism such as a belt et cetera and a slide mechanism of the type described above. In addition, the up-down unit 60 is disposed in the base 51. The up-down unit 60 is comprised, for example, of a cylinder mechanism and a pressure supply source, and has a function that allows for up-down movement of the first and the second hands 52, 53. These four units 57-60 are connected to the controller 4 so that their operations are controlled by the controller 4.

In the transfer robot 50 configured as above, the direction in which the first and the second hands 52 and 53 can make extension and retraction movement (that is, the direction) by rotation of the base 51 by the rotation unit 57, whereby the first and the second hands 52, 53 can be extended and retracted by the first and the second extension and retraction units 58, 59. By combination of these movements, it becomes possible for the first and the second hands 52, 53 to travel to the standby position where the substrate transfer relay device 25 lies, to receive substrates 6 supported in the substrate transfer relay device 25 and then to transfer the substrates 6 thus received into plural process chambers 23 arranged around the robot chamber 22.

The process chamber 23 which is a vacuumed chamber contains therein devices for performing various process treatments on the substrate 6 placed therein. The process chambers 23 are arranged along the outer periphery of the robot chamber 22, and are situated radially with respect to the rotation center, L1, of the base 51. In the present embodiment, the process module 3 includes four process chambers 23, two of which are disposed on one side in the direction of rotation of the base 51 relative to the substrate transfer relay device 25 and another two of which are disposed on the other side.

In the present embodiment, the blades 55, 56 of the first and the second hands 52, 53 are provided such that the number thereof corresponds to the number of the process chambers 23 arranged on the one rotation directional side, to the number of the process chambers 23 arranged on the other rotation directional side and to the number of the support sections 38, 39, 43, 44 of each of the support bodies 28, 29 of the substrate transfer relay device 25. In other words, each of the number of the process chambers 23 arranged on the one rotation directional side and the number of the process chambers 23 arranged on the other rotation directional side is two and the number of the support sections of each of the supports bodies 28, 29 is two. Therefore, the number of the blades 55, 56 is also two. In addition, of the four process chambers 23, the two process chambers 23 positioned on the one rotation directional side with respect to the substrate transfer relay device 25 are a first process chamber 23A and a second process chamber 23B. And, of these two process chambers, the one that is closer to the substrate transfer relay device 25 than the other is the first process chamber 23A. On the other hand, the two process chambers 23 positioned on the other rotation directional side with respect to the substrate transfer relay device 25 are a third process chamber 23C and a fourth process chamber 23D. And, of these two process chambers, the one that is closer to the substrate transfer relay device 25 than the other is the third process chamber 23C.

Additionally, the process chamber 23 is disposed in the robot chamber 22 through the third gate 73. And, by opening the third gate 73, the interior of the process chamber 23 and the interior of the robot chamber 22 are connected, whereas by closing the third gate 73, the interior of the process chamber 23 and the interior of the robot chamber 22 are disconnected. The third gate 73 which is directed to the rotational center, L1, of the base 51 is configured so as to allow the first and the second hands 52, 53 to pass therethrough with the substrates 6 placed thereon. Therefore, by making the base 51 rotate so that the direction in which the first and the second hands 52, 53 travel corresponds to the opening surface of the third gate 73 and then by making the first and the second hands 52, 53 move forward, it becomes possible that the substrates 6 carried thereon are transferred to the mounting base (not shown) within the process chamber 23 situated at the transfer position 101, 102, 103 or 104, and the substrates 6 on the mounting base within the process chamber 23 are placed thereon. In addition, after the loading, the substrates 6 are transferred to outside the process chamber 23 by making the hand body 54 move backward.

(Controller)

The substrate processing system 1 configured as above includes the controller 4, and the movements of the robot 8, the robot 50 and the device 25 are controlled by the controller 4. The controller 4 has a memory section 62, a control section 63, a transport robot driving section 64, a relay device driving section 65 and a transfer robot driving section 66. The memory section 62 has a function capable of storing programs and various types of information, and is connected to the control section 63. The control section 63 is connected to the first to the fourth laser sensors 46-49, and has a function capable of deciding which of the support sections 38, 39, 43, 44 holds a substrate 6 and then making the memory section 62 store the detection result. In addition, the control section 63 is connected to the transport robot driving section 64, the relay device driving section 65, the transfer robot driving section 66 and the gate driving section 67, and has a function capable of controlling, based on the programs stored in the memory section 62, the operation of each driving section 64-67.

The transport robot driving section 64 which is connected to the up-down unit 16 of the transport robot 8 has a function that allows for up and down movement of the hand 15 by driving the up-down unit 16. In addition, the transport robot driving section 64 which is also connected to the first to the third rotation units 17-19 of the transport robot 8 has a function that allows for rotational movement of the arms 12-14 of the transport robot 8 by driving the first to the third rotation units 17-19.

The relay device driving section 65 which is connected to the up-down driving unit 27 of the substrate transfer relay device 25 has a function that allows for up and down movement of the support sections 38, 39, 43, 44 by driving the up-down driving unit 27. In addition, the transfer robot driving section 66 is connected to the rotation unit 57, the first extension and retraction unit 58, the second extension and retraction unit 59 and the up-down unit 60 of the transfer robot 50. The transfer robot driving section 66 has such a function that the direction of the first and the second hands 52, 53 is changed by the rotation unit 57; the first and the second hands 52, 53 are extended and retracted independently from each other by the first and the second extension and retraction units 58, 59; and the hand body 54 is moved up and down by the up-down unit 60.

Furthermore, the gate driving section 67 which is connected to the control section 63 has such a function that the switch unit (not shown) for opening and closing the first to the third gates 71-73 is driven to open and close the first to the third gates 71-73. In the substrate processing system 1, based on the programs stored in the memory section 62, the controller 4 having such functions controls the operation of the transport robot 8, the operation of the substrate transfer relay device 25 and the operation of the transfer robot 50, whereby to execute the following transport and transfer processes. In the following, the transport process will be described first by making reference to FIGS. 1-6.

(Transport Process)

With the hooks 9 mounted to the housing 7, the substrate processing system 1 is placed in operation, and after completion of the vacuum drawing of the process chambers 23 and so on, the transport process will be carried out. In the transport process, the controller 4 first controls the operation of the first to the third rotation units 17-19 so that the first to the third arms 12-14 are rotated for the hand 15 to travel up to the front of a hoop 9. Subsequently, the controller 4 controls the operation of the up-down unit 16 for adjustment of the height of the hand 15 so that the hand 15 is positioned directly underneath the designated substrates 6 in the hoop 9. Thereafter, the controller 4 directs the first to the third arms 12-14 to rotate so that the hand 15 is inserted in the hoop 9. Further, the hand 15 is moved upward by the up-down unit 16 so that the substrates 6 are placed and held on the hand 15. After holding of the substrates 6, the controller 4 directs the first to the third arms 12-14 to rotate so that the hand 15 is withdrawn from within the hoop 9, and then directs the first gate 71 to open, and while being moved downward by the up-down unit 16, the hand 15 is moved to the substrate transfer relay device 25.

At the time when the hand 15 is moved to the substrate transfer relay device 25, the controller 4 controls the operation of the first to the third arms 12-14 so that the hand 15 is positioned between the pair of the second support sections 44, 44 when viewed from top and at least a portion of the outer circumferential edge of the substrates 6 on the hand 15 overlaps with both ends of the pair of the second support sections 44, 44. Furthermore, the hand 15 is arranged such that its height is somewhat higher than that of the pair of the second support sections 44, 44. When the hand 15 is arranged as above, the controller 4 directs the up-down unit 16 to move so that the hand 15 moves downward. As a result of this, the substrates 6 on the hand 15 are placed onto the pair of the second support sections 44, 44. And the substrates 6 are delivered to the pair of the second support bodies 29.

Thereafter, the controller 4 directs the first to the third arms 12-14 to rotate so that the hand 15 is withdrawn from the substrate transfer relay device 25. At this time, if the controller 4 detects the fact that the substrates 6 are placed on the first support bodies 28 by means of the first and the second laser sensors 46, 47, then the controller 4 directs the first to the third arms 12-14 to rotate so that the hand 15 is arranged immediately underneath the substrates 6. After such arrangement, the controller 4 directs the up-down unit 16 to move so that the hand 15 moves upward. The substrates 6 are placed and received on the hand 15. And, the hand 15 is again withdrawn from the substrate transfer relay device 25. The hand 15 thus withdrawn is brought back to the front of another hoop 9 for accommodation of the treated substrates 6 therein, whereby the substrates 6 put on the hand 15 are accommodated in the hoop 9. Also after that, the controller 4 directs the hand 15 to move so that another designated substrates 6 are delivered, in the same way as described above, to the pair of the second support sections 43, 43, while the substrates 6 on the pair of the support bodies 28 are received by the hand 15. These delivery operations are carried out repeatedly by control of the operation of the transport robot driving section 64 by the controller 4.

(Transfer Process)

Figure 7:
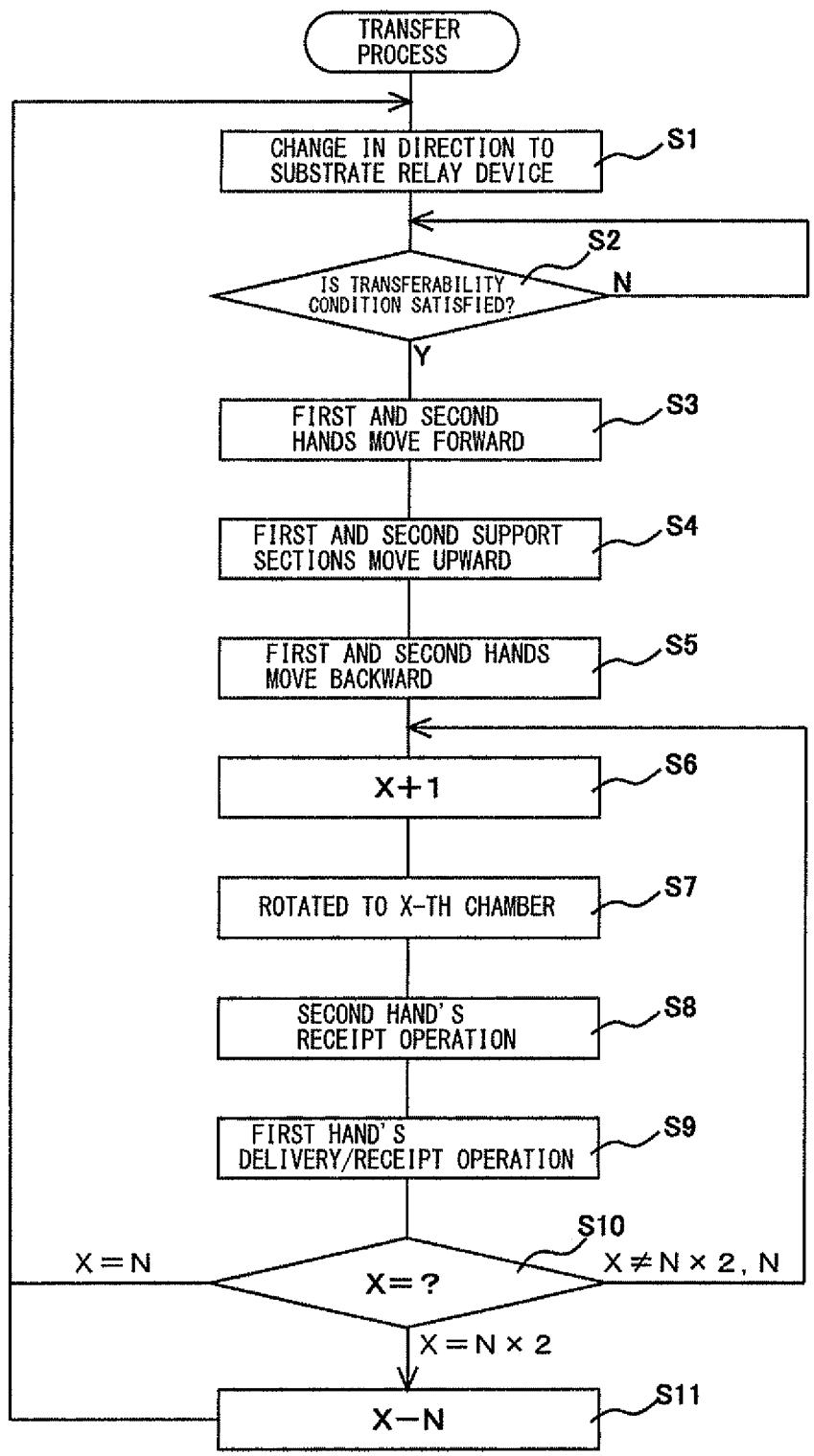
FIG. 7 is a flowchart that represents a procedure for a transfer process by the transfer robot.

In addition, the controller 4 carries out a transfer process as shown in the flowchart of FIG. 7 in concurrence with a transport process for transfer of substrates 6 by the transport robot 8. Like the transport process, the transfer process is carried out after completion of the vacuuming of the process chambers 23 and so on. If the transfer operation starts and advances to step S1, then a first transfer step begins. The controller 4 first directs the base 51 to rotate so that the first and the second hands 52, 53 are directed in the direction of the substrate transfer relay device 25, thereby allowing for insertion of the first and the second hands 52, 53 in the substrate transfer relay device 25. After entry into this state, the flow moves to step S2.

In step S2, based on the signals from the first to the fourth laser sensors 46-49, the controller 4 detects the presence or absence of substrates 6 on the first and the second support bodies 28, 29 and then determines whether or not the transferability condition is met. What is meant here by the "transferability condition" is that no substrates 6 are placed on the first support bodies 28 while two substrates 6 are carried on the second support bodies 29. If the controller 4 decides that the transferability condition is not met, then the transfer robot 50 is placed on standby, and the controller 4 repeatedly makes a decision until the transferability condition is met. If it is decided that the transferability condition is satisfied, the flow then moves to step S3.

Figure 8A:
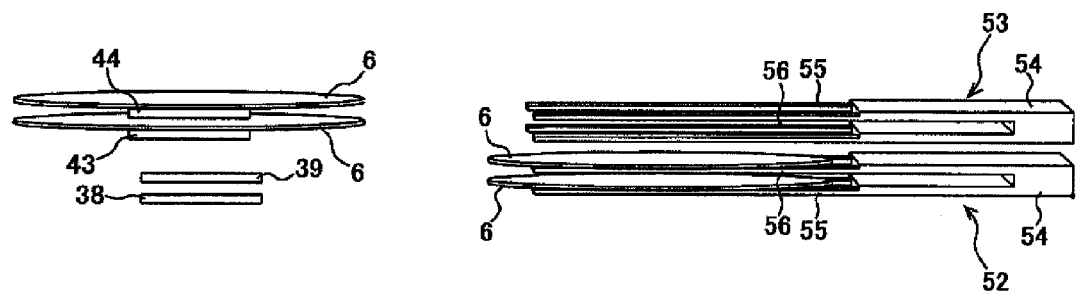
FIG. 8 is a schematic diagram showing movements of the first and the second hands and the support bodies of the substrate transfer relay device, at the time of delivery of substrates to the substrate transfer relay device.

In step S3, the controller 4 first directs the second gate 72 to open and then directs the first and the second extension and retraction units 58, 59 to move so that the first and the second hands 52, 53 move forward to the standby position where the substrate transfer relay device 25 lies. At this time, in the substrate transfer relay device 25, the pair of the first support bodies 28 and the pair of the second support bodies 29 are located at the separated position (see FIG. 5). And the two blades 55, 56 of the first hand 52 are respectively located immediately underneath the substrates 6 on the pair of the second support sections 43, 43 and the substrates 6 on the pair of the second support sections 44, 44. And in the step to be hereinafter described, the substrates 6 placed on the two blades 55, 56 of the second hand 53 are respectively located immediately above the pair of the first support sections 38, 38 and the pair of the first support sections 39, 39 (see FIG. 8(a)). After the first and the second hands 52, 53 are moved forward to the standby position, the flow moves to step S4.

Figure 8B:
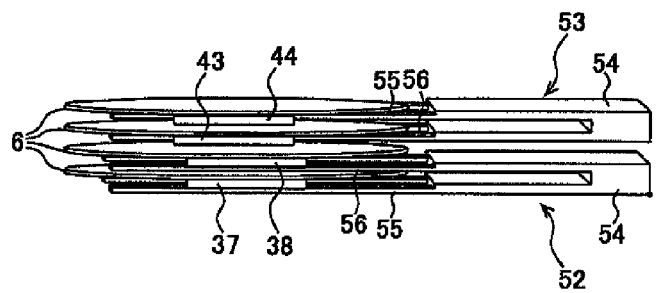
Figure 8C:
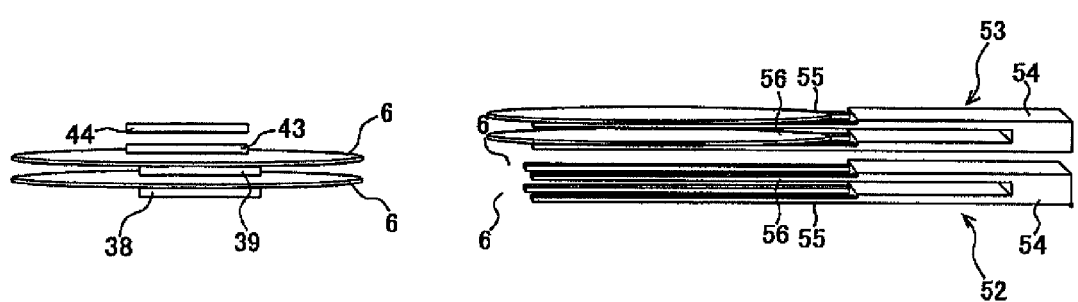

In step S4, the controller 4 sets the up-down driving unit 27 of the substrate transfer relay device 25 in motion so that the pair of the first support bodies 28 move upward. As a result of this, the two substrates 6 overlying the second hand 53 are respectively placed onto the pair of the first support sections 38, 38 and the pair of the first support sections 39, 39, and then lifted upward (see FIG. 8(b)), and these two substrates 6 are handed over from the second hand 53 to the pair of the first support bodies 28. In addition, cooperatively with upward movement of the pair of the first support bodies 28, the pair of the second support bodies 29 move downwards, and the substrates 6 on the pair of the second support sections 43, 43 and the substrates 6 on the pair of the second support suctions 44, 44 are put respectively on the two blades 55, 56 of the first hand 52 (see FIG. 8(c)). As a result of this, the two substrates 6 on the pair of the second support bodies 29 are handed over to the first hand 52. Upon completion of the delivery of the substrates 6 between the substrate transfer relay device 25 and the transfer robot 50, the flow now moves to step S5.

In step S5, the controller 4 directs that the first and the second hands 52, 53 are moved backward by the first and the second extension and retraction units 58, 59 so that they are withdrawn from the substrate transfer relay device 25. And, the controller 4 directs that the first and the second hands 52, 53 are moved backward to the rotation position where the base 51 and the hand body 54 overlap with each other, and the second gate 72 is closed. After the first and the second hands 52, 53 are returned to the rotation position, the flow moves to step S6.

In step S6, the control section 63 adds 1 to the variable X (default: 0) stored in the memory section 62. After the addition of 1 to the variable X, the flows moves to step S7. In step S7, the controller 4 directs the base 51 to rotate so that the direction of the first and the second hands 52, 53 is changed to the third gate 73 of the X-th process chamber (X=1, 2; 3 and 4). If, say, X=1, then the first and the second hands 52, 53 are directed towards the third gate 73 of the first process chamber 23A. After the change of direction as described above, the flow moves to step S8.

In step S8, the controller 4 first directs that the third gate 73 is opened, and the second hand 53 moves forward to the mount base (not shown) of the first process chamber 23A. Placed on this mount base is the treated substrate 6 in the first process chamber 23A, and the height (level) of the second hand 53 is adjusted by the controller 5 so that the upper blade 55 of the second hand 53 is positioned under the treated substrate 6. In addition, the height of the second hand 53 may be adjusted either prior to forward movement or during forward movement. After the movement to the mount base, the controller 4 directs that the second hand 53 is moved upward by the up-down unit 60, and the substrate 6 on the mount base is placed on the upper blade 56 and then lifted upward. In the way as described above, the transfer robot 50 receives the treated substrate 6 in the first process chamber 23A with the aid of the second hand 53. After the reception, the controller 4 directs that the second hand 53 is moved backward by the second extension and retraction unit 59, and when the second hand 53 is brought back to the rotation position, the flow moves to step S9.

In step S9, the first hand 52 is moved forward to the mount base of the first process chamber 23A by the first extension and retraction unit 58. The height of the first hand 52 is adjusted by the controller 4 so that the untreated substrate 6 on the lower blade 55 of the first hand 52 is positioned higher than the mount base. In addition, the height of the first hand 52 may be adjusted either prior to forward movement or during forward movement. After the movement to the mount base, the controller 4 directs that the first hand 52 is moved downward by the up-down unit 60 so that the untreated substrate 6 on the lower blade 55 is put and left on the mount base. As a result of this, the untreated substrate 6 is handed over from the first hand 52 to the mount base in the first process chamber 23A. After the delivery, the controller 4 directs that the first hand 52 is moved backward by the first extension and retraction unit 58, and the third gate 73 is closed. And, when the first hand 52 is brought back to the rotation position, the flow moves to step S10.

Figure 9:
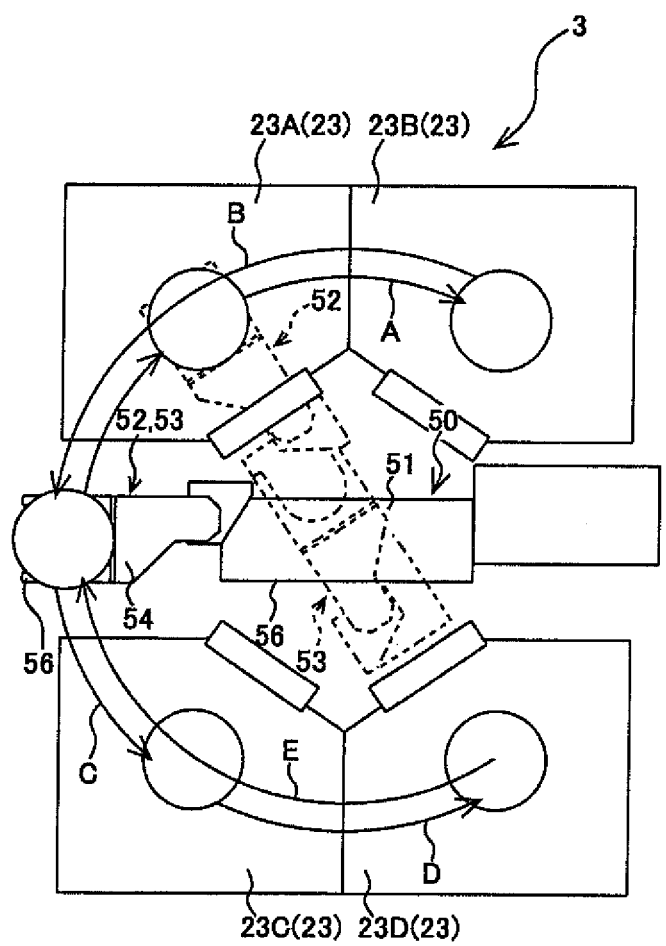
FIG. 9 is an enlarged top plan view showing in an enlarged manner movements of the transfer robot, at the time of execution of the transfer process.

In step S10, it is decided whether or not the variable X satisfies any of the following first to third conditions. The first condition is that X, N, N~2; the second condition is that X=N; and the third condition is that X=N~2. Here, N is a number indicative of the number of blades of each of the first and the second hands 52, 53, and in the present embodiment, N=2. If, say, X=1, then the decision is that the first condition is satisfied, and the flow returns to step S6. In step S6, 1 is added to X, and the flow moves to step S7. In step S7, the first and the second hands 52, 53 are rotated as indicated by arrow sign A of FIG. 9 so that they are directed towards the third gate 73 of the (X+1)-th process chamber 23, i.e., the third gate 73 of the second process chamber 23B, and the flow moves to step S8.

In step S8, the controller 4 directs the second hand 53 to move forward for reception of the treated substrate 6 on the mount base of the second process chamber 23B. At this time, the upper blade 56 of the second hand 53 already carries thereon the treated substrate 6. Therefore, the height of the second hand 53 is adjusted by the controller 4 such that the lower blade 55 is located under the treated substrate 6 on the mount base. And, the controller 4 directs the second hand 53 to travel to the mount base. Thereafter the second hand 53 is moved upward so that the substrate 6 on the mount base is placed on the lower blade 55 and then lifted upward. In the way as described above, the transfer robot 50 receives the treated substrate 6 in the second process chamber 23B with the aid of the second hand 53. After the reception, the controller 4 directs the second hand 53 to move backward, and when the second hand 53 is brought back to the rotation position, the flow moves to step S9.

In step S9, the controller 4 directs the first hand 52 to move forward for handover of the untreated substrate 6 to the mount base of the second process chamber 23B. At this time, the untreated substrate 6 is placed only on the upper blade 56 of the first hand 52. Therefore, the height of the first hand 52 is adjusted by the controller 4 such that the untreated substrate 6 on the upper blade 56 of the first hand 52 is located higher than the mount base. And the controller 4 directs the first hand 52 to travel to the mount base. Thereafter, the first hand 52 is moved downward so that the untreated substrate 6 on the upper blade 56 is placed and left on the mount base. As a result of this, the untreated substrate 6 is handed over from the transfer robot 50 onto the mount base of the second process chamber 23B. The controller 4 directs the first hand 52 to move backward, and the third gate 73 is closed. And, when the first hand 52 is brought back to the rotation position, the first transfer process for transfer of the substrates 6 to the first and the second process chamber 23A, 23B is completed. Upon completion of the first transfer process, the flow moves again to step S10.

In step S10 at this time, the control section 63 decides that, since the variable X=2, the second condition is satisfied. And, the flow moves back to step S1 to start a second transfer process. In step S1, the controller 4 directs the first and the second hands 52, 53 to rotate as indicated by arrow sign B from the second process chamber 23B so that the first and the second hands 52, 53 are directed to the substrate transfer relay device 25. And, in step S2, it is decided whether or not the transferability condition is satisfied. If decided to be satisfied, then the first and the second hands 52, 53 are moved forward in step S3. And, in step S4, the first and the second support bodies 28, 29 of the substrate transfer relay device 25 are moved up and down for delivery of the untreated and treated substrates 6 between the substrate transfer relay device 25 and the first and the second hands 52, 53. Further, in step S5, the first and the second hands 52, 53 are moved backward, and the flow moves to step S6.

In step S6, 1 is added to X, and the flow moves to step S7. In step S7, the first and the second hands 52, 53 are rotated as indicated by arrow sign C of FIG. 9 so that they are directed towards the third process chamber 23C. And, similar to the way in which the treated and untreated substrates 6 are delivered and received in the first process chamber 23A, the treated and untreated substrates 6 are delivered in the third process chamber 23C (steps S8 and S9), and upon completion of the delivery, the flow moves to step S10.

In step S10 at this time, since the variable X=3, the control section 63 decides that the first condition is satisfied. And, the flow moves back to step S6. In step S6, 1 is added to X, and the flow moves to step S7. In step S7, the first and the second hands 52, 53 are rotated as indicated by arrow sign D of FIG. 9 so that they are directed towards the fourth process chamber 23D. And, similar to the way in which the treated and untreated substrates 6 are delivered in the first process chamber 23A, the substrates 6 are delivered in the fourth process chamber 23D (steps S8 and S9), and upon completion of the delivery, the second transfer process for transfer of the substrates 6 to the third and the fourth process chambers 23C, 23D is completed. Upon completion of the second transfer process, the flow moves to step S10.

In step S10 at this time, since the variable X=4, the control section 63 decides that the third condition is satisfied, and the flow moves to step S11. In step S11, N is subtracted from X. That is, a subtraction of X=X ? N is performed so that the result is: X=0. After the subtraction, the flow moves back to step S1, and the first transfer process will restart.

As described above, in the transfer robot 50 of the present embodiment, two substrates 6 are received at the same time by the two blades 55, 56 of the first hand 52 while two substrates 6 are handed over at the same time by the two blades 55, 56 of the second hand 53 in the substrate transfer relay device 25 located in the standby position. In addition, it is possible that two substrates 6 retained in the first hand 52 are handed over in succession to the two process chambers 23 while two treated substrates 6 are received in succession from within two process chambers 23 by the second hand 53. As a result of this, what is required is just to bring, subsequently to the delivery of the substrates 6 at the two process chambers 23, the first and the second hands 52, 53 back to the substrate transfer relay device 25, whereby it becomes possible to shorten the distance that the first and the second hands 52, 53 need to travel in a single transfer process, thereby making it possible to reduce the transfer time that elapses before the substrates are respectively transferred to the transfer positions 101-104.

In addition, in the substrate processing system 1 of the present embodiment, the transport process of the transport robot 8 is carried out in concurrency with the transfer process of the transfer robot 50, and it is arranged such that during the transfer process, two substrates 6 are transported to the substrate transfer relay device 25 from the hoop 9 by the transport process. Therefore, it becomes possible to reduce the time required for delivery of the substrates 6 between the substrate transfer relay device 25 and the hoop 9, thereby making it possible to reduce the transfer time. In addition, it is arranged such that during the transfer process, the transport robot 8 receives two treated substrates 6 placed in the substrate transfer relay device 25 by the transport process, whereby the treated substrates 6 held in the blades 55, 56 of the second hand 53 are handed over simultaneously with receipt at the substrate transfer relay device 25, thereby eliminating the need for transport from the substrate transfer relay device 25 to the hoop 9. Therefore, the transfer time can be shortened.

In addition, in the transfer robot 50 of the present embodiment, the number of process chambers 23 to which substrates are to be transferred in the first and the second transfer processes is equal to the number of blades 55, 56 of the first and the second hands 52, 53, whereby the delivery operation can be carried out in succession with respect to every process chamber 23 to which substrates are to be transferred respectively in the first and the second transfer processes. As a result of this, there is no need for making a hand return to the substrate transfer relay device 25 every time the delivery operation to each process chamber 23 is completed, thereby making it possible to reduce the transfer time.

Furthermore, the number of process chambers 23 arranged on the one rotation-directional side with respect to the substrate transfer relay device 25 and the number of process chambers 23 arranged on the opposite rotation-directional side are the same, and the transfer process is divided such that the process of transfer to the process chambers 23C, 23D arranged on the one side is a first transfer process whereas the process of transfer to the process chambers 23C, 23D arranged on the opposite side is a second transfer process. This makes it possible that the cables or the like (not shown) for establishing connections between each element of the transfer robot 50 and the controller is prevented from becoming twisted when the transfer robot 50 rotates one turn. In addition, the same number of process chambers is provided on either side relative to the rotational direction of the substrate transfer relay device 25, whereby the travel distance in the first transfer process is about the same as that in the second transfer process, thereby making it possible to reduce the total travel distance in the first and the second transfer processes. This makes it possible to achieve a reduction in the transfer time. Furthermore, by division into two transfer processes, it becomes possible to hold down the travel distance while holding down the number of blades 55, 56. Therefore, if the increase in the number of parts is controlled, it becomes possible to achieve a reduction in the transfer time at the same time.

In addition, the present embodiment makes it possible that the operation of delivery between the first hand 52 and the substrate transfer relay device 25 can be carried out simultaneously with the operation of delivery between the second hand 53 and the substrate transfer relay device 25, thereby making it possible to reduce the time taken for substrate delivery between the first and the second hands 52, 53 and the substrate transfer relay device 25. In addition, such simultaneous operations of substrate delivery between the first and the second hands 52, 53 and the substrate transfer relay device 25 eliminate the need to set the first and the second hands 52, 53 in motion. Therefore, the travel distance of the first and the second hands 52, 53 can be reduced, thereby making it possible to achieve a reduction in the transfer time.

Furthermore, the substrate transfer relay device 25 of the present embodiment employs a rack and pinion mechanism capable of cooperation of the first and the second support bodies 28, 29, thereby holding down the number of component parts. This makes it possible to hold down the cost of manufacture of the substrate transfer relay device 25.

Other Embodiments

Figure 10A:
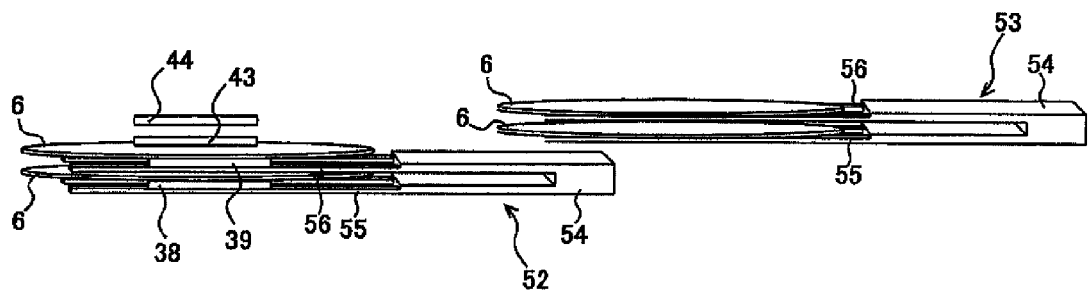
FIG. 10 is a schematic diagram showing movements of the first and the second hands and the support bodies of the substrate transfer relay device, at the time of delivery of substrates to the substrate transfer relay device in a substrate processing system according to a second embodiment of the present invention.
Figure 10B:
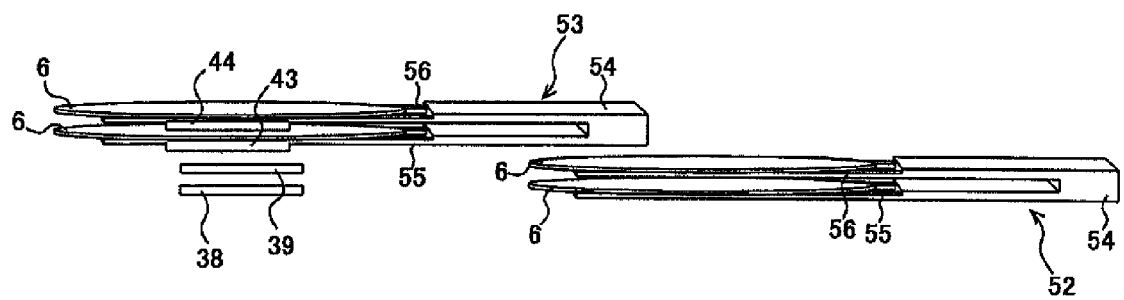

In the foregoing embodiment, the first and the second hands 52, 53 of the transfer robot 50 are moved forward in the direction of the substrate transfer relay device 25 at the same time. However, as it is shown in FIG. 10, it may be arranged such that the second hand 53 is first made to move forward for receipt of two substrates 6 on the pair of the first support bodies 28 (see FIG. 10(a)), and thereafter the first hand 52 is made to move forward for handover of two substrates 6 thereon to the substrate transfer relay device 25 (see FIG. 10(b)). In this case, there is no need for the substrate transfer relay device 25 to be equipped with the up-down driving unit 27, and it is only necessary that the second hand 53 is made to move upward at the time of receipt of two substrates 6 from the substrate transfer relay device 25 while on the other hand the first hand 52 is made to move downward at the time of handover of two substrates 6 to the substrate transfer relay device 25.

As has been described above, by directing the first hand 52 to extend and retract and to move up and down, it becomes possible to receive two substrates 6 from the substrate transfer relay device 25, and just by directing the second hand 53 to extend and retract and to move up and down, it becomes possible to place two substrates 6 on the substrate transfer relay device 25. Therefore, not only the hold time but also the placement time can be reduced.

In addition, the number of the first hands 52, the number of the second hands 53, the number of the blades 55, 56 of the first hand 52, the number of the blades 55, 56 of the second hand 53, the number of the process chambers 23 and their layout positions are not limited to those as described above. The number of hands may be more than two. The number of blades may be more than 2. In addition, the number of process chambers may be more than four. In addition, the relationship between the number of blades and the number of process chambers and the number of support sections of the substrate transfer relay device 25 may not be the same as the one as described above, and it suffices if the number of process chambers to which substrates are to be transferred in at least a single transfer process is less than the number of blades and the number of support sections.

Numerous modifications and alternative embodiments of the invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention and all modifications which come within the scope of the appended claims are reserved.

REFERENCE SIGNS LIST 4 controller
6 substrate
8 transport robot
9 hoop
15 hand
23 process chamber
23A first process chamber
23B second process chamber
23C third process chamber
23D fourth process chamber
25 substrate transfer relay device
28 first support body
29 second support body
30 up-down cylinder mechanism
33 cooperative mechanism
32 first up-down mechanism
34 second up-down mechanism 38, 39 first support section
43, 44 second support section
50 transfer robot
52 first hand
53 second hand
54 hand body
55 blade
56 blade
57 rotation unit
58 first extension and retraction unit
59 second extension and retraction unit
60 up-down unit
66 transfer robot driving section

What is claimed is:

1. A transfer robot comprising:
   a first hand having a predetermined N holding sections, each of the N holding sections for holding a substrate among a plurality of substrates;
   a second hand having a predetermined N holding sections, each of the N holding sections for holding a substrate among a plurality of substrates;
   a moving device configured such that the first hand and the second hand rotate together to move to: (i) a standby position where the substrates are located, and (ii) a plurality of different transfer positions, each of the holding sections of the first hand receives a substrate from among the plurality of substrates located at the standby position, substrates previously placed at the transfer positions are then received by each of the holding sections of the second hand, and the substrates held by the holding sections of the first hand are sequentially handed over to the transfer positions; and
   the controller programmed such that: (i) the first hand receives the substrates at the standby position, and (ii) the second hand hands over the substrates at the standby position, wherein
   the transfer positions include N transfer positions located at one side of the standby position in the rotation direction and N transfer positions located at the other side of the standby position in the rotation direction, and
   the moving device is configured such that:
     in a first transfer step, subsequent to receipt of substrates at the standby position, the first hand and the second hand are rotated towards the one side to sequentially move to the N transfer positions situated on the one side so that the received substrates are handed over to the respective N transfer positions situated on the one side, and
     in a second transfer step, subsequent to receipt of substrates at the standby position, the first hand and the second hand are rotated towards the other side to sequentially move to the N transfer positions situated on the other side so that the received substrates are handed over to the respective N transfer positions situated on the other side.

2. The transfer robot as set forth in claim 1, wherein the standby position is a position at which the substrates can be kept on standby and at which the substrates are delivered between the standby position and a hoop by a transport robot, and
   the moving device moves the first hand and the second hand so that the substrates held by the N holding sections of the second hand are placed at the standby position.

3. The transfer robot as set forth in claim 1, wherein the N that is representative of the number of the transfer positions is two.

4. The transfer robot as set forth in claim 1, wherein the moving device is configured such that the first hand and the second hand are moved such that the substrates placed at the standby position are received at one time by the N holding sections of the first hand while the substrates held respectively by the N holding sections of the second hand are placed and handed over at one time to the standby position.

5. The transfer robot as set forth in claim 4, wherein:
   the moving device includes (i) an extension and retraction unit by which the first hand and the second hand are individually extended and retracted in their respective extending directions, and (ii) an up-down unit by which the first hand and the second hand are moved up and down together;
   after the N holding sections of the first hand are extended respectively under the substrates placed at the standby position by the extension and retraction unit, the first hand and the second hand are moved up by the up-down unit, whereby the substrates placed at the standby position are held at one time by the holding sections of the first hand, after which the first hand is retracted by the extension and retraction unit for reception of the substrates from the standby position; and
   after the N holding sections of the second hand are extended above the standby position by the extension and retraction unit, the first hand and the second hand are moved down by the up-down unit, whereby the substrates held by the holding sections of the second hand are placed at the standby position at one time, after which the second hand is retracted by the extension and retraction unit for handover of the substrates to the standby position.

6. A substrate transfer method for a transfer robot,
   the transfer robot comprising:
     a first hand having a predetermined N holding sections, each of the N holding sections for holding a substrate among a plurality of substrates;
     a second hand having a predetermined N holding sections, each of the N holding sections for holding a substrate among a plurality of substrates;
     a moving device configured such that the first hand and the second hand rotate together to move to: (i) a standby position where the plurality of substrates are located, and (ii) a plurality of different transfer positions, each of the holding sections of the first hand receives a substrate from among the plurality of substrates located at the standby position, substrates previously placed at the transfer positions are then received by each of the holding sections of the second hand, and the substrates held by the holding sections of the first hand are sequentially handed over to the transfer positions; and
     the controller programmed such that: (i) the first hand receives the substrates at the standby position, and (ii) the second hand hands over the substrates at the standby position, wherein
     the transfer positions include N transfer positions located at one side of the standby position in the rotation direction and N transfer positions located at the other side of the standby position in the rotation direction,
   the substrate transfer method comprising:
     a first receipt step in which, by the moving device, the N holding sections of the first hand respectively hold and receive the substrates placed at the standby position;

a first transfer step, after the first receipt step, of rotating the first hand and the second hand toward the one side to sequentially move the first hand and the second hand to the N transfer positions located at the one side, and handing over the substrates to the N transfer positions located at the one side;

a second receipt step, after the first transfer step, of causing the moving device to return the first hand and the second hand to the standby position and causing the holding sections of the first hand to hold and receive the substrates placed at the standby position; and a second transfer step, after the receipt of the substrates from the standby position, of causing the first hand and the second hand to rotate toward the other side to sequentially move the first hand and the second hand to the N transfer positions located at the one side and handing over the substrates to the N transfer positions located at the other side.

7. The substrate transfer method as set forth in claim 6, wherein:

the standby position is a position at which the substrates can be kept on standby and at which the substrates are delivered between itself and a hoop by a transport robot; and the substrate transfer method further includes a handover step in which the moving device moves the first hand and the second hand so that the substrates held by the N holding sections of the second hand are placed at the standby position.

8. The substrate transfer method as set forth in claim 7, wherein the receipt step and the handover step are carried out at the same time.

9. The substrate transfer method as set forth in claim 6, wherein, in the transfer step, the substrates are sequentially delivered to the adjacent transfer positions.

10. A substrate transfer relay device for relaying a plurality of substrates at a time of substrate delivery between a transfer robot and a transport robot, which respectively have a plurality of hands for holding the plurality of substrates, the substrate transfer relay device comprising:

a first support body having a first support section for supporting at least one of the plurality of substrates, by upward movement of the first support body, a substrate supported by the hand is received and supported by the first support section, and by downward movement of the first support body, the at least one substrate supported by the first support section is handed over to the hand;

a second support body having a second support section for supporting at least one of the plurality of substrates, such that in a plan view, the at least one substrate supported by the second support section overlaps the at least one substrate supported by the first support section, and by upward movement of the second support body, a substrate supported by the hand is received and supported by the second support section and by downward movement of the second support body, the substrate supported by the second support section is handed over to the hand;

a first up-down mechanism configured to move the first support body up and down; and a second up-down mechanism configured to move the second support body up and down, the second up-down mechanism being configured to move the second support body downward when the first up-down mechanism moves the first support body upward and the second up-down mechanism being configured to move the second support body upward when the first up-down mechanism moves the first support body downward, wherein the first up-down mechanism and the second up-down mechanism are configured such that one of the first and second support bodies is moved up to receive the substrate supported by the hand, and the other of the first and second support bodies is moved down to hand over the substrate to another one of the hands.

11. The substrate transfer relay device as set forth in claim 10, wherein:

at least one of the transfer robot and the transport robot is provided with two hands serving respectively as a first hand and a second hand;

the first hand and the second hand are disposed side by side at a predetermined vertical distance from each other, each of the first hand and the second hand has N holding sections for holding respective substrates where N is an integer number equal to or more than two;

the first support body includes N first support sections lined up in a vertical direction at predetermined intervals, the N first support sections supporting respective substrates so that they are aligned in the vertical direction;

the second support body includes N second support sections lined up in the vertical direction at predetermined intervals, the N second support sections supporting respective substrates so that they are aligned in the vertical direction;

the N first support sections are provided correspondingly to the N holding sections of the first hand, wherein by upward and downward movement of the first support body, substrates are delivered between the N first support sections and their corresponding N holding sections; and the N second support sections are provided correspondingly to the N holding sections of the second hand wherein by upward and downward movement of the second support body, substrates are delivered between the N second support sections and their corresponding N holding sections.

12. The substrate transfer relay device as set forth in claim 11, wherein the first support sections and the second support sections each include a pair of hook-shaped members spaced apart across a space in a predetermined horizontal direction, the pairs of hook-shaped members being formed respectively in the first support body and the second support body so as to support an outer edge of substrates.

13. The substrate transfer relay device as set forth in claim 10, wherein:

the first up-down mechanism is an up-down cylinder mechanism for up and down movement of the first support body; and the second up-down mechanism is a rack and pinion mechanism for moving the second support body up and down according to up and down movement of the first support body so that the first support body and the second support body move up and down in opposite directions to each other.

14. The transfer robot according to claim 1, wherein the moving device is configured such that in each of the first and second transfer steps: (i) the first hand and the second hand are sequentially moved to the N transfer positions without returning to the standby position, (ii) the holding sections of the second hand receives the substrates placed at the transfer positions, and (iii) the holding sections of the first hand hands over the substrates to the transfer positions.

15. The transfer robot according to claim 6, wherein the moving device is configured such that in each of the first and second transfer steps: (i) the first hand and the second hand are sequentially moved to the N transfer positions without returning to the standby position, (ii) the holding sections of the second hand receives the substrates placed at the transfer positions, and (iii) the holding sections of the first hand hands over the substrates to the transfer positions.

* * * * *